United States Patent
Manuel et al.

(10) Patent No.: US 10,798,836 B2
(45) Date of Patent: Oct. 6, 2020

(54) POWERED HINGE MECHANISMS

(71) Applicant: Samsung Electronics Co., Ltd., Gyeonggi-Do (KR)

(72) Inventors: Steven Manuel, San Mateo, CA (US); Sajid Sadi, San Jose, CA (US); Curtis Aumiller, San Jose, CA (US); Thomas Brenner, Sunnyvale, CA (US)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 71 days.

(21) Appl. No.: 15/672,940

(22) Filed: Aug. 9, 2017

(65) Prior Publication Data

US 2018/0049336 A1     Feb. 15, 2018

Related U.S. Application Data

(60) Provisional application No. 62/373,271, filed on Aug. 10, 2016.

(51) Int. Cl.
*E05D 11/08* (2006.01)
*E05F 1/12* (2006.01)
(Continued)

(52) U.S. Cl.
CPC ....... *H05K 5/0226* (2013.01); *E05B 65/0067* (2013.01); *E05C 19/16* (2013.01); *E05D 1/00* (2013.01); *E05D 3/122* (2013.01); *E05D 7/00* (2013.01); *E05D 11/06* (2013.01); *E05D 11/1028* (2013.01); *E05F 1/12* (2013.01); *E05F 3/20* (2013.01); *F16C 11/04* (2013.01);
(Continued)

(58) Field of Classification Search
CPC ........ G06F 1/16; G06F 1/1662; G06F 1/1664; G06F 1/1666; G06F 1/1601; H05K 5/00; E05D 3/18; E05D 11/0054; E05D 11/08; E05D 1/12; E05F 1/12
USPC .......... 16/286, 291, 292, 297, 343, 372, 373
See application file for complete search history.

(56) References Cited

U.S. PATENT DOCUMENTS

| 86,978 A | * | 2/1869 | Fredericks ...................... 16/286 |
| 769,201 A | * | 9/1904 | Van Blarcom ............ E05F 5/02 16/68 |

(Continued)

FOREIGN PATENT DOCUMENTS

| EP | 1507388 A1 | 3/2004 |
| EP | 2632118 A1 | 12/2012 |

(Continued)

OTHER PUBLICATIONS

WIPO Appln. PCT/KR2017/008659, International Serach Report and Written Opinion, dated Nov. 24, 2017, 17 pg.

(Continued)

*Primary Examiner* — Emily M Morgan
(74) *Attorney, Agent, or Firm* — Cuenot, Forsythe & Kim, LLC

(57) ABSTRACT

A device can include a hinge mechanism rotatably coupling a first portion of the device to a second portion of the device. The hinge mechanism is configured to automatically open the device. The device can also include a damper configured to control a rate at which the hinge mechanism automatically opens the device. The hinge mechanism can include a spine hinge, a rolling contact hinge, a film hinge, or a geared link hinge.

14 Claims, 22 Drawing Sheets

(51) Int. Cl.
*H05K 5/02* (2006.01)
*H04M 1/02* (2006.01)
*E05B 65/00* (2006.01)
*E05C 19/16* (2006.01)
*E05D 1/00* (2006.01)
*E05D 3/12* (2006.01)
*E05D 7/00* (2006.01)
*E05D 11/06* (2006.01)
*E05D 11/10* (2006.01)
*E05F 3/20* (2006.01)
*F16C 11/04* (2006.01)
*F16C 11/12* (2006.01)
*G06F 1/16* (2006.01)
*E05C 17/00* (2006.01)
*E05B 63/00* (2006.01)
*E05D 11/00* (2006.01)
*H01F 7/02* (2006.01)

(52) U.S. Cl.
CPC ............ *F16C 11/12* (2013.01); *G06F 1/1681* (2013.01); *H04M 1/0216* (2013.01); *E05B 63/0008* (2013.01); *E05C 17/025* (2013.01); *E05D 11/0081* (2013.01); *E05F 1/1253* (2013.01); *E05Y 2900/606* (2013.01); *G06F 1/1679* (2013.01); *G06F 1/1683* (2013.01); *H01F 7/0205* (2013.01); *H04M 1/022* (2013.01)

(56) References Cited

U.S. PATENT DOCUMENTS

| | | | | |
|---|---|---|---|---|
| 869,717 A * | 10/1907 | Kluge | ............... | E05D 11/0054 16/250 |
| 895,124 A * | 8/1908 | Sundee | ............... | B65D 45/16 220/326 |
| 1,455,133 A * | 5/1923 | Downs | ............... | B65D 45/06 220/326 |
| 1,467,124 A * | 9/1923 | Sunde | ............... | E05F 1/1253 16/286 |
| 2,568,225 A * | 9/1951 | Doman | ............... | E05F 1/1041 16/292 |
| 2,705,337 A * | 4/1955 | Langdon | ............... | E05F 1/10 16/66 |
| 3,183,550 A * | 5/1965 | Phelps | ............... | A45C 13/34 16/290 |
| 3,362,042 A * | 1/1968 | Salice | ............... | E05D 11/1021 16/278 |
| 3,658,241 A * | 4/1972 | Pistocchi | ............... | F41A 9/60 232/1 R |
| 3,827,105 A * | 8/1974 | Branchaud | ............ | E05F 1/1246 16/286 |
| 4,393,541 A * | 7/1983 | Hujsak | ................ | B25J 17/0241 16/291 |
| 5,419,084 A * | 5/1995 | Sankey | ................ | E06B 7/367 16/250 |
| 5,715,573 A * | 2/1998 | Holemans | ............. | B64G 1/222 16/287 |
| 6,530,498 B1 * | 3/2003 | Ovadia | ............... | A45C 13/007 16/286 |
| 6,708,046 B1 | 3/2004 | Takagi | | |
| 7,406,749 B2 * | 8/2008 | Herper | ............... | E05F 5/006 16/286 |
| 8,159,834 B2 | 4/2012 | Griffin et al. | | |
| 8,861,224 B2 | 10/2014 | Griffin et al. | | |
| 8,982,542 B2 | 3/2015 | Bohn | | |
| 9,115,750 B2 | 8/2015 | Park | | |
| 9,173,306 B2 | 10/2015 | Lim et al. | | |
| 9,190,640 B2 | 11/2015 | Sohn et al. | | |
| 9,304,549 B2 | 4/2016 | Siddiqui | | |
| 9,423,833 B2 | 8/2016 | Sano et al. | | |
| 9,447,620 B2 | 9/2016 | Park et al. | | |
| 9,451,818 B2 | 9/2016 | Buechin | | |
| 2006/0101617 A1 * | 5/2006 | Webb | ................ | E06B 7/367 16/250 |
| 2006/0133052 A1 * | 6/2006 | Harmon | ............... | G06F 1/1616 361/752 |
| 2006/0138913 A1 * | 6/2006 | Kim | ................ | G06F 1/1601 312/223.1 |
| 2007/0028418 A1 * | 2/2007 | Kilpinen | ............... | G06F 1/1616 16/286 |
| 2010/0288786 A1 * | 11/2010 | Spence | ............... | A22B 7/008 220/828 |
| 2012/0046081 A1 | 2/2012 | Riddiford et al. | | |
| 2014/0185215 A1 | 7/2014 | Whitt, III et al. | | |
| 2015/0237748 A1 * | 8/2015 | Andre | ............... | E05B 65/0067 361/679.55 |
| 2015/0309544 A1 | 10/2015 | McCracken et al. | | |
| 2016/0090768 A1 * | 3/2016 | Mooers | ............... | E05F 1/12 16/251 |
| 2016/0116943 A1 | 4/2016 | Becze | | |
| 2016/0186474 A1 | 6/2016 | Tong et al. | | |
| 2018/0049336 A1 * | 2/2018 | Manuel | ............... | E05B 65/0067 |

FOREIGN PATENT DOCUMENTS

KR      20150082918 A      7/2015
KR      20150096827 A      8/2015

OTHER PUBLICATIONS

EPO Appln. 17839819.4, Extended European Search Report, dated Jul. 12, 2019, 7 pg.

* cited by examiner

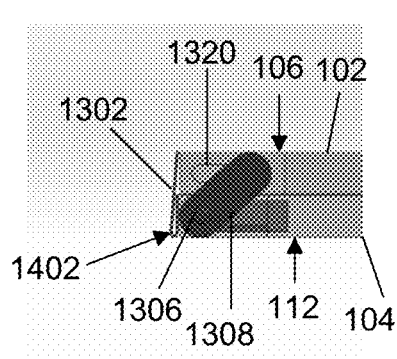
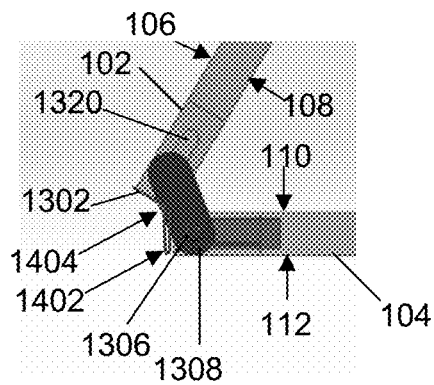
FIG. 14-1    FIG. 14-2
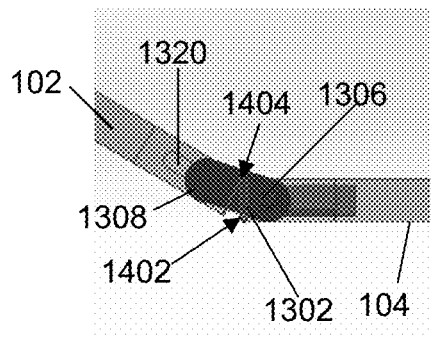
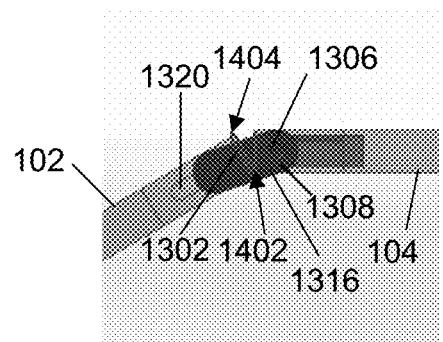
FIG. 14-3    FIG. 14-4
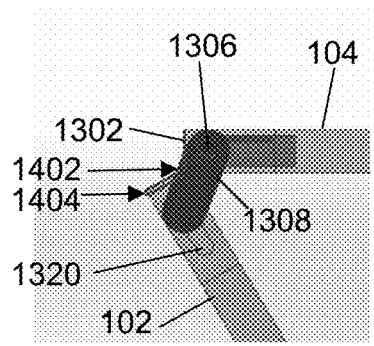
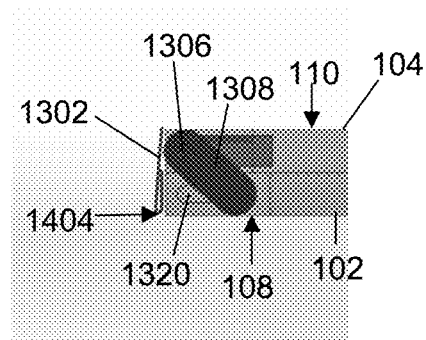
FIG. 14-5    FIG. 14-6

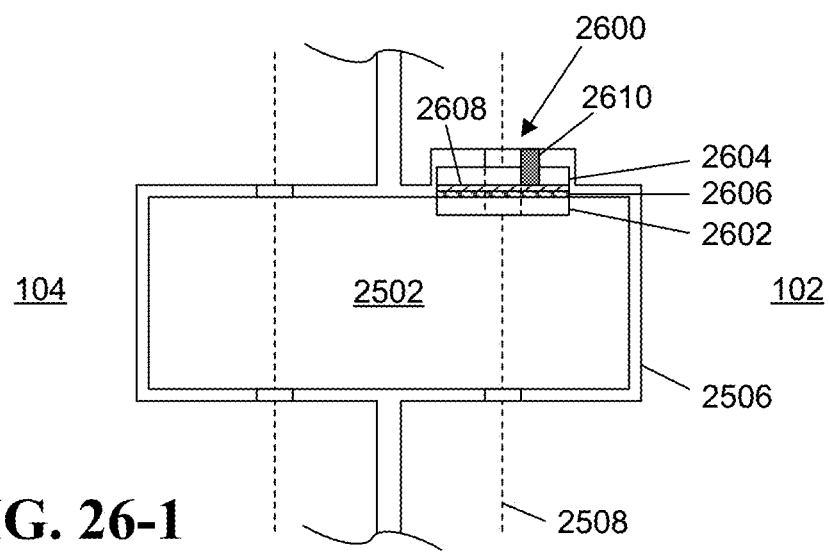
FIG. 26-1
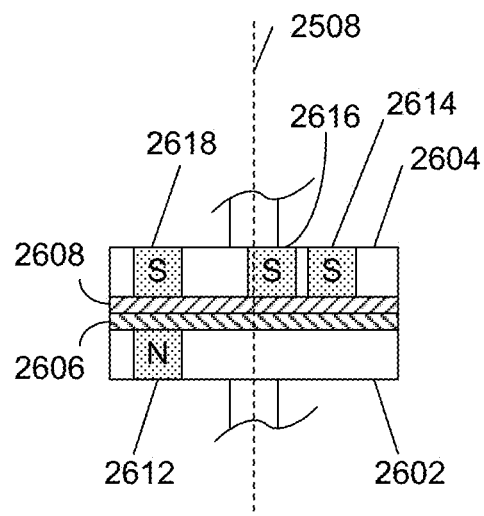
FIG. 26-2
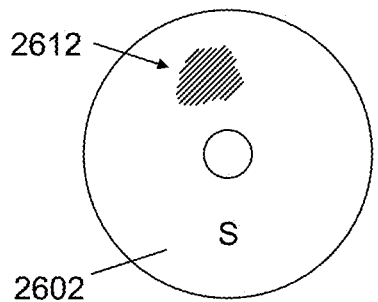
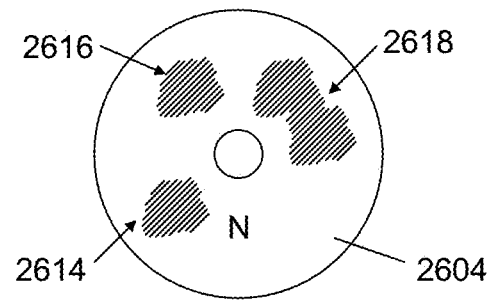
FIG. 26-3  FIG. 26-4

POWERED HINGE MECHANISMS

CROSS-REFERENCE TO RELATED APPLICATIONS

This application claims the benefit of U.S. Provisional Patent Application No. 62/373,271 filed on Aug. 10, 2016, which is fully incorporated herein by reference.

TECHNICAL FIELD

This disclosure relates to powered hinge mechanisms.

BACKGROUND

A variety of different types of devices incorporate hinges that allow the devices to open and close. Examples of hinged devices include flip-style mobile phones, devices that have a cover or lid coupled to the body of the device though the hinge, and devices that fold in half about the hinge. Typically, a user manually pulls the hinged portions of the device apart using one's fingers to open the device.

SUMMARY

One or more embodiments are directed to a device. In an aspect, a device can include a hinge mechanism rotatably coupling a first portion of the device to a second portion of the device. The hinge mechanism is configured to automatically open the device. The device can also include a damper configured to control a rate at which the hinge mechanism automatically opens the device. The hinge mechanism can include a spine hinge, a rolling contact hinge, a film hinge, or a geared link hinge.

One or more embodiments are directed to a method. In an aspect, a method can include providing a hinge mechanism rotatably coupling a first portion of a device to a second portion of the device. The hinge mechanism is configured to automatically open the device. The method can also include providing a damper configured to control a rate at which the hinge mechanism automatically opens the device. The hinge mechanism can include a spine hinge, a rolling contact hinge, a film hinge, or a geared link hinge.

This Summary section is provided merely to introduce certain concepts and not to identify any key or essential features of the claimed subject matter. Many other features and embodiments of the invention will be apparent from the accompanying drawings and from the following detailed description.

BRIEF DESCRIPTION OF THE DRAWINGS

The accompanying drawings show one or more embodiments; however, the accompanying drawings should not be taken to limit the invention to only the embodiments shown. Various aspects and advantages will become apparent upon review of the following detailed description and upon reference to the drawings.

FIGS. 8-1 through 8-5 are cross-sectional side views of the device of FIG. 7.

FIGS. 14-1 through 14-6 are cross-sectional side views of the device of FIG. 13 illustrating 360-degree rotation using the film hinge.

FIGS. 17-1 through 17-2 are perspective cutaway views illustrating the example geared hinge of FIG. 16.

FIGS. 20-1 and 20-4 are perspective cutaway views of the geared hinge of FIG. 19.

FIGS. 22-1 and 22-2 are perspective cutaway views of the example geared hinge of FIG. 21.

FIGS. 25-1 and 25-2 illustrate an example of a cam/rocker position stop mechanism.

FIGS. 26-1 through 26-4 illustrate an example of a magnetic brake.

FIGS. 27-1 and 27-2 are side cutaway views illustrating another example of a spine hinge.

DETAILED DESCRIPTION

While the disclosure concludes with claims defining novel features, it is believed that the various features described herein will be better understood from a consideration of the description in conjunction with the drawings. The process(es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to powered hinge mechanisms. In one or more embodiments, the hinge mechanism supports automatic opening of a device. The hinge mechanism is capable of providing the power or force necessary to automatically open a device. For example, the hinge mechanism is capable of opening the device when a latch maintaining the device in a closed position is released. Under power of the hinge mechanism, the device opens without the user having to expend any effort such as pulling the device apart by hand. In one or more embodiments, the hinge mechanism is capable of providing approximately 180 degrees of rotation. In particular embodiments, the hinge mechanism is capable of providing approximately 360 degrees of rotation.

In one or more embodiments, the hinge mechanism is incorporated into a device such as a portable computing device. As an illustrative and non-limiting example, the device may be a mobile phone. In one or more embodiments, the mobile phone includes a first portion coupled to a second portion through the hinge mechanism. In an aspect, each of the two portions may include or incorporate a display screen. While a mobile phone is provided as an example of a device that includes a hinge mechanism as described herein, it should be appreciated that the example embodiments described within this disclosure may be incorporated within any of a variety of different types of devices. For example, a hinge mechanism as described herein may be used to couple a housing of a device to a lid or couple an additional display to a housing or other structure that may or may not include a display.

Further aspects of the inventive arrangements are described below in greater detail with reference to the figures. For purposes of simplicity and clarity of illustration, elements shown in the figures are not necessarily drawn to scale. For example, the dimensions of some of the elements may be exaggerated relative to other elements for clarity. Further, where considered appropriate, reference numbers are repeated among the figures to indicate corresponding, analogous, or like features.

Figure 1:
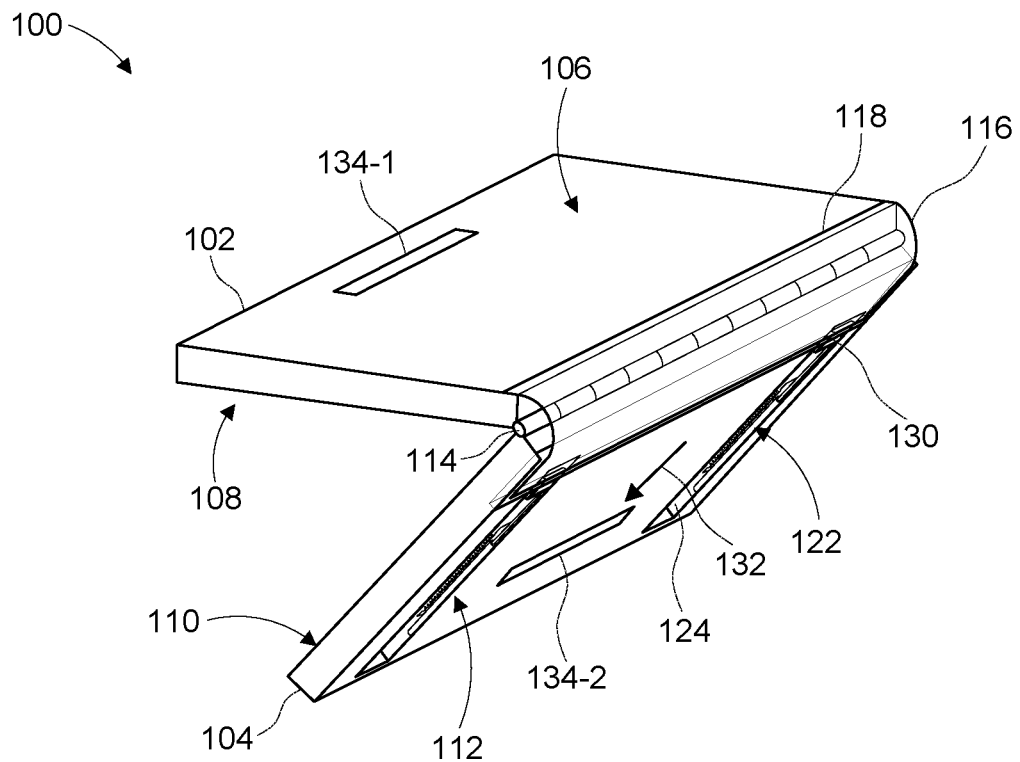
FIGS. 1 and 2 are perspective cutaway views of a device with an example hinge mechanism.
Figure 2:
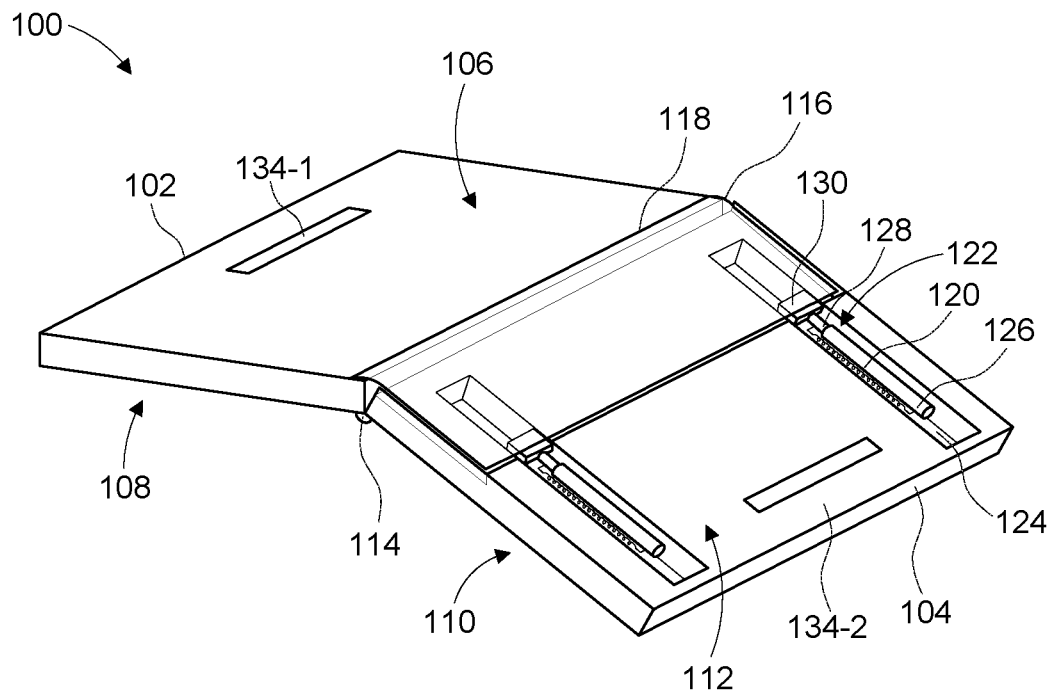

FIGS. 1 and 2 are perspective cutaway views of a device 100 with an example hinge mechanism. In the examples of FIGS. 1 and 2, the hinge mechanism is a spine hinge. Referring to FIGS. 1 and 2 collectively, a device 100 has a portion 102 and a portion 104. Each of portions 102 and 104, for example, may be a portion of the body of device 100. Portion 102 has a surface 106 and a surface 108. Portion 104 has a surface 110 and a surface 112. In the closed position, surface 108 is in contact with surface 110 forming an angle of 0 degrees or approximately 0 degrees.

In the example of FIGS. 1 and 2, portion 102 and portion 104 are coupled by a hinge mechanism that includes a hinge 114 and a spine 116. Portion 102 is capable of rotating around portion 104 about an axis of rotation defined by hinge 114. In the closed position, device 100 resembles a closed book with spine 116 covering hinge 114 similar to a spine of a book covering the binding of the book. Spine 116 has an edge 118 that is attached to an edge of portion 102. In an embodiment, edge 118 is attached, e.g., fixedly attached, to surface 106. Edge 118 may be attached using an adhesive, fasteners, a bonding process, or other suitable attachment mechanism or process.

In one or more embodiments, spine 116 is coupled to a spring 120 and a damper 122. Spring 120 and damper 122 are located within a channel 124 that resides within portion 104. Spring 120 and damper 122 are oriented parallel to the plane formed by surface 112 and perpendicular to edge 118 of spine 116 and to the edge of spine 116 that is opposite edge 118. In particular embodiments, spring 120 is included in the hinge mechanism. Spring 120 provides the force necessary to automatically open device 100. Damper 122 is capable of providing a dampening force that opposes the force exerted by spring 120. In the example of FIGS. 1 and 2, damper 122 is implemented as a linear damper. In one or more embodiments, damper 122 has a twin tube structure. Further, damper 122 may be pneumatic or hydraulic.

Referring to the example of FIGS. 1 and 2, damper 122 has a damper base 126 and damper member 128. Damper base 126 may be implemented as an outer tube that is attached to portion 104 within channel 124. Damper base 126 has an end that is capable of receiving damper member 128. Damper member 128 may be implemented as a piston, for example. Damper member 128 is moveable into and out of damper base 126. An end of damper member 128 that remains outside of damper base 126 is attached to a fastener 130. Fastener 130 is attached to spine 116, e.g., the edge of spine 116 opposite edge 118. Spring 120 is coupled to damper 122. For example, a first end of spring 120 is attached to damper base 126. A second end of spring 120 is coupled to damper member 128. Accordingly, damper 122 is capable of controlling the rate at which spring 120 is able to open device 100. For example, the rate at which device 100 opens is controlled by the dampening effect generated by damper 122 countering the force exerted by spring 120.

When device 100 is in the closed position with surface 108 in contact with surface 110, spring 120 is extended so as to exert sufficient force to open device 100. Device 100, for example, can include a latch 134 (shown as 134-1 and 134-2 in respective portions 102 and 104) that maintains device 100 in the closed position. When the latch 134 is released, device 100 opens due to the force exerted by spring 120. In the closed position, spine 116 is largely external to portion 104. A small portion of spine 116 is within a track formed within portion 104, which is revealed in the cutaway view of FIGS. 1 and 2. In response to the latch 134 being released, spring 120 pulls spine 116 down the track within portion 104 in the direction of arrow 132. Spring 120 draws spine 116 deeper within the track. As spine 116 is drawn deeper within the track, the portion of spine 116 within the track maintains an orientation that is substantially parallel to surface 112.

In the example of FIGS. 1 and 2, two damper/spring assemblies are shown. Each damper/spring assembly is located in a dedicated channel. In another embodiment, a single damper/spring assembly may be used. In that case, channel 124 may be located at a position that is approximately midway between the two channels illustrated in FIGS. 1 and 2. In another embodiment, three or more damper/spring assemblies may be used. For example, in cases where three or more damper/spring assemblies are used, each such assembly may be located in a different channel and the channels may be spaced approximately equidistant from one another.

Referring to FIG. 1, device 100 is shown in an open position with the spine hinge forming an angle less than 90 degrees. The spine hinge is retractable. Referring to FIG. 2, device 100 is shown in an open position so that the spine hinge forms an angle greater than 90 degrees. In the example of FIGS. 1 and 2, device 100 is capable of opening to an angle of approximately 180 degrees as measured from surface 108 to surface 110.

Example materials for implementing portions 102 and 104 include, but are not limited to, plastic, metal, ceramic, and other suitable materials. Example materials for implementing spine 116 include, but are not limited to plastic, metal sheeting, metal mesh, fabric, and other suitable materials. For example, spine 116 is flexible so as to bend as illustrated in FIGS. 1 and 2 to support 180-degree rotation. Still, spine 116 is also capable of maintaining a general shape or form (e.g., curvature) as illustrated in FIGS. 1 and 2.

Figure 3:
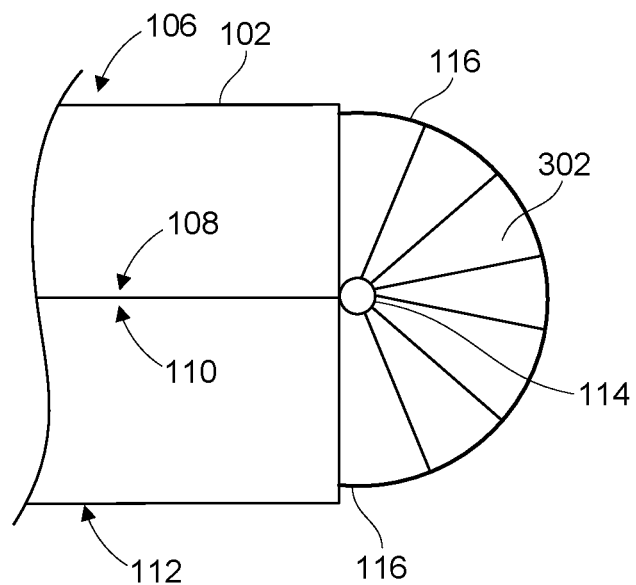
FIGS. 3 and 4 are side views of the device of FIGS. 1 and 2 including the example spine hinge.
Figure 4:
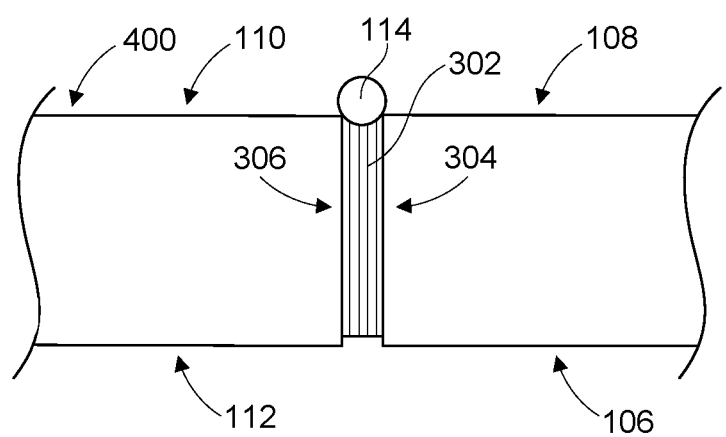

FIGS. 3 and 4 are side views of device 100 of FIGS. 1 and 2 with the example spine hinge. In the example of FIG. 3, device 100 is in a closed position and is viewed from the side. Edge 118 of spine 116 is attached to portion 102 within a slot extending inside of portion 102. Spine 116 is also within the track of portion 104. In the example of FIG. 3, a side covering 302 is added to each side of device 100 to close off the area between spine 116 and hinge 114. In one or more embodiments, side covering 302 is implemented as a bellows. Side covering 302 is capable of expanding when device 100 is in the closed position as illustrated in FIG. 3. When in an open position as illustrated in FIG. 4, side covering(s) 302 is capable of collapsing, e.g., folding, between the respective ends of portions 102 and 104 beneath hinge 114. Side cover 302 is capable of providing support for spine 116 so that spine 116 maintains a desired curvature at least while device 100 is in the closed position.

Spine 116 is capable of bridging between portion 102 and portion 104. Spine 116 is positioned opposite hinge 114, e.g., as a fulcrum. As device 100 opens from the closed position, spine 116 retracts into portion 104. As device 100 closes from an open position, spine 116 withdraws from portion 104.

In one or more embodiments, side covering 302 may be an outer covering. In that case, device 100 may have another internally sealed volume within side covering 302 and spine 116. The internally sealed volume may be water tight and is capable of connecting the edges of portions 102 and 104. Side covering 302 may be external. In one or more embodiments, side covering 302 provides further protection to the internally sealed volume. In particular embodiments, side covering 302 is capable providing an improved esthetic to device 100. As an illustrative and non-limiting example, within side covering 302 and spine 116, device 100 can have a water tight bellows or a flexible membrane connecting, e.g., attached to, end 304 of portion 104 and end 306 of portion 106. The water tight region, for example, may allow electrical wires to pass between portion 102 and portion 104.

Figure 5:
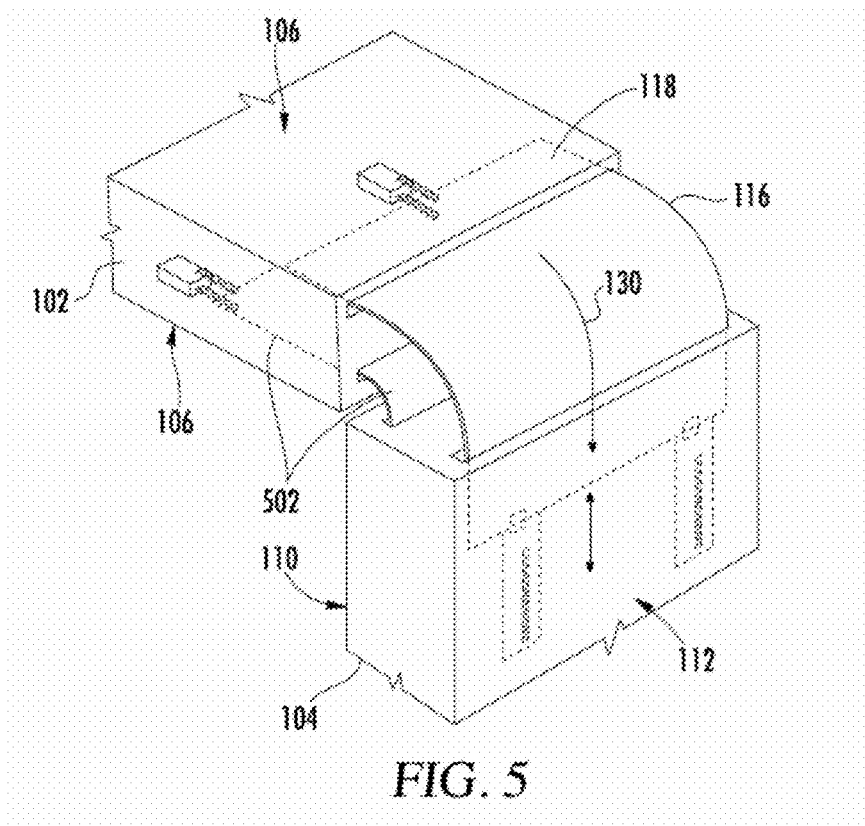
FIG. 5 is a perspective cutaway view of a device including another example of a spine hinge.
Figure 6:
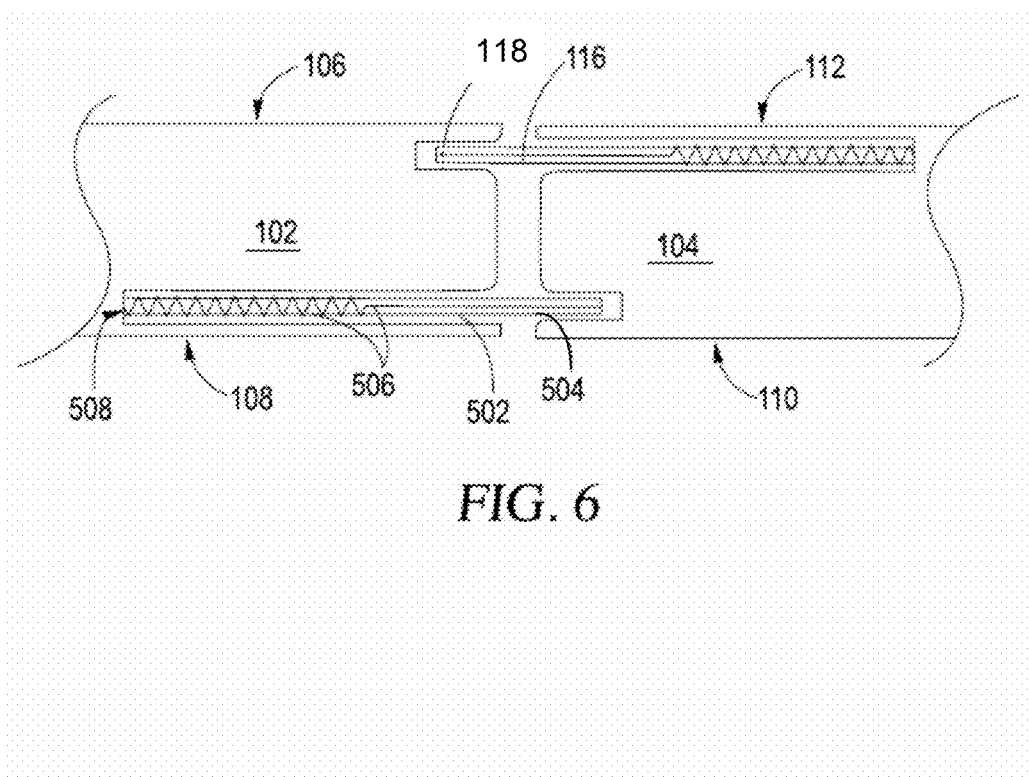
FIG. 6 illustrates a cross-sectional side view the device of FIG. 5.

FIG. 5 is a perspective cutaway view of device 100 including another example of a spine hinge. FIG. 6 illustrates a cross-sectional side view of the example spine hinge of FIG. 5. Referring to FIGS. 5 and 6 collectively, the spine hinge is capable of providing 360 degrees or approximately 360 degrees of rotation. Further, a hinge (e.g., hinge 114) is not included to facilitate the 360 degrees of rotation. The example of FIGS. 5 and 6 includes an additional spine 502. Spine 502 is attached in an opposing manner compared to spine 116. For example, whereas spine 116 has edge 118 attached to portion 102, spine 502 has an edge 504 attached to portion 104.

As illustrated in FIG. 6, edge 504 is attached to a surface of portion 104 located within a slot within portion 104. Spine 502 is coupled to a spring/damper assembly 506 within a channel 508 of portion 102. Spine 502 may be coupled to one or more spring/damper assemblies 506 as described with reference to spring 120 and damper 122 of FIGS. 1-4. It should be appreciated that the particular configuration of spring/damper assembly 506 and number of such assemblies may be implemented to match the spring/damper assembly and number of such assemblies in portion 104. For example, as the cross-section of FIG. 6 illustrates, spring/damper assembly 506 may be aligned below the spring 120 and damper 122 assembly in portion 104.

Accordingly, in the closed position, spine 116 is substantially extracted from portion 104, while spine 502 is substantially retracted within portion 102. In the 180-degree open position illustrated in FIG. 6, both spine 116 and spine 502 are substantially retracted. As device 100 is rotated beyond the 180-degree open position of FIG. 6, spine 502 is pulled from channel 508 so that spine 502 is substantially extracted from portion 102, while spine 116 is substantially retracted within portion 104.

In the examples of FIGS. 1-6, one end of the spines is fixedly attached to one of the portions of device 100. In the examples shown, the spines are attached within slots in the portions. In particular embodiments, the spines can be fixedly attached to the outer surface of the appropriate portion. For example, spine 502 can be coupled to surface 110 of portion 104, while spine 116 is attached to surface 106 of portion 102. Spines 116 and/or 502 may be fixedly attached to one of portions 102 or 104 as the case may be using any of a variety of suitable attachment mechanisms. Further, spines 116 and/or 502 may be fixedly attached to any of a variety of locations on portion 102 or 104, as the case may be.

Figure 7:
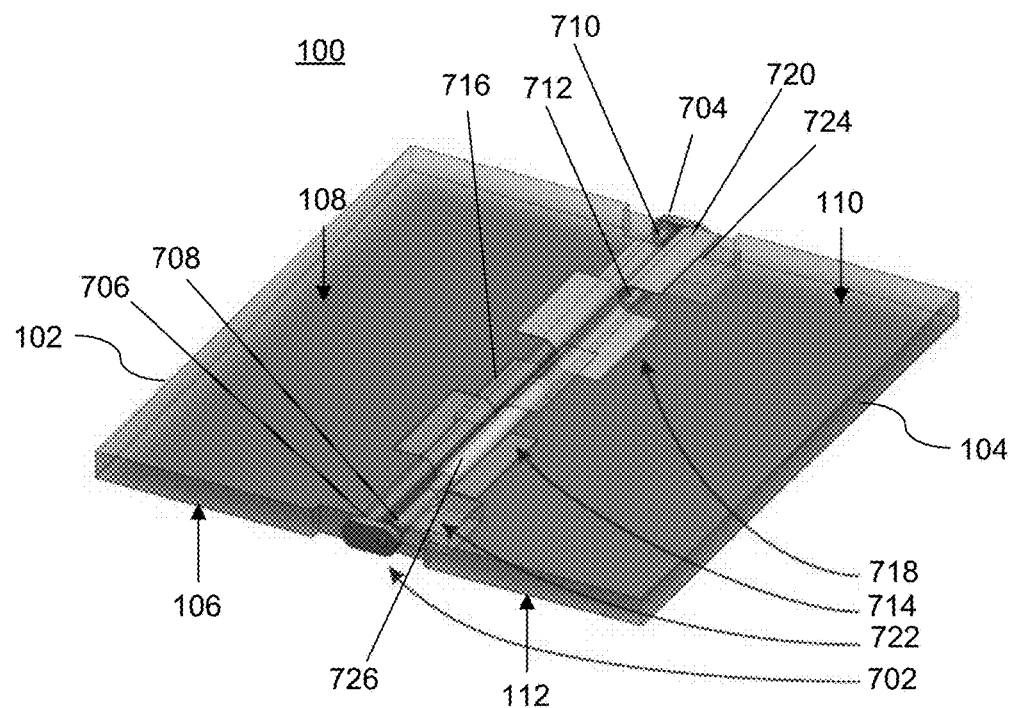
FIG. 7 is a perspective cutaway view of a device with another example hinge mechanism.
Figures 1, 8:
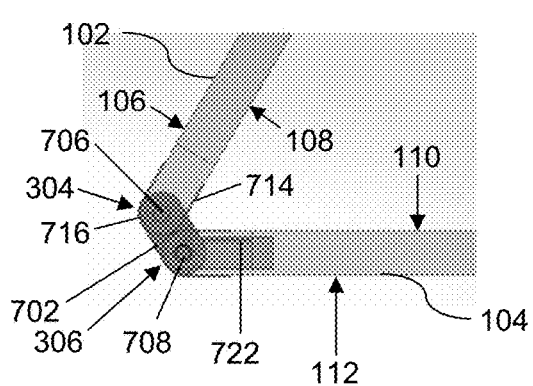
Figures 2, 8:
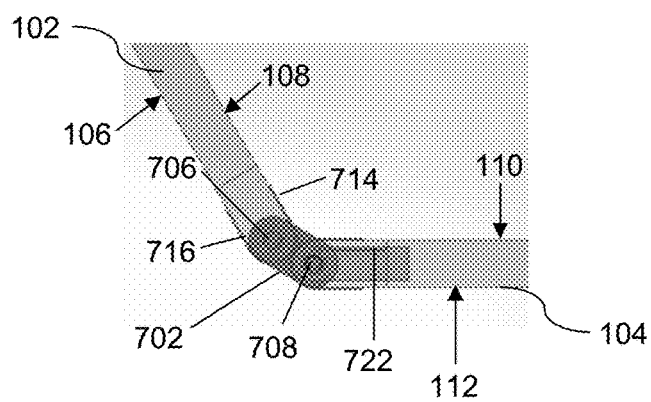
Figures 3, 8:
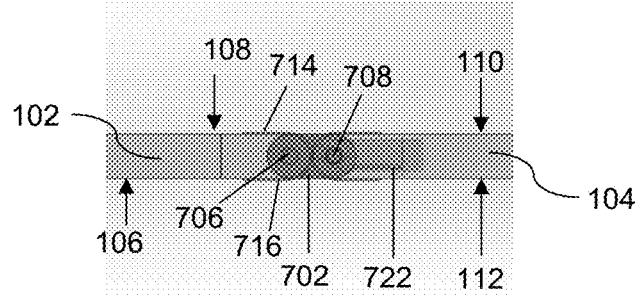
Figures 4, 8:
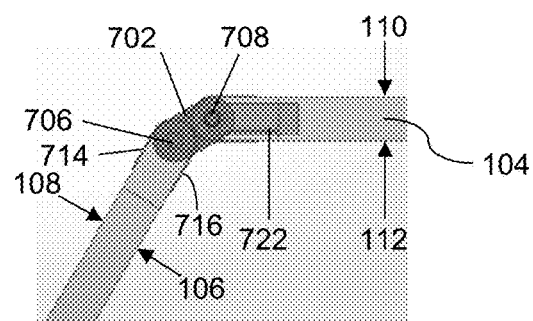
Figures 5, 8:
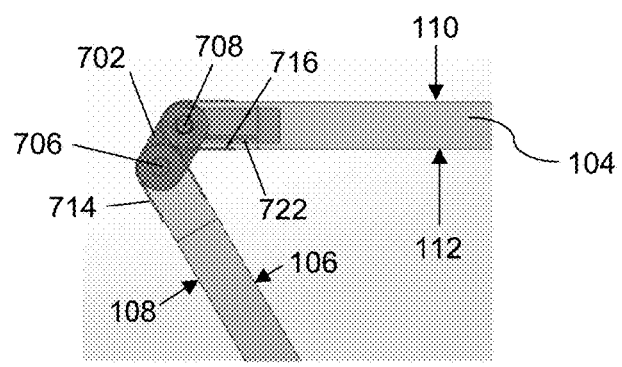

FIG. 7 is a perspective cutaway view of device 100 with another example of a hinge mechanism. In the example of FIG. 7, the hinge mechanism is a rolling contact hinge. FIGS. 8-1 through 8-5, are cross-sectional side views of the device of FIG. 7. Referring to FIGS. 7 and 8 collectively, device 100 has a rolling contact hinge that includes linkages 702 and 704. In particular embodiments, the ends of portions 102 and 104 are curved or rounded. For example, the ends of portions 102 and 104 may be hemi-cylindrical as opposed to other shapes such as rectangular as pictured in FIGS. 1-6. Linkage 702 includes pins 706 and 708. Linkage 704 includes pins 710 and 712. Pins 706 and 710 are engaged by portion 102, e.g., holes or a circular shaped channel within portion 102. Pins 708 and 712 are engaged by portion 104. In the example of FIGS. 7 and 8, portion 102 is capable of rotating about an axis formed by pins 706 and 710. Portion 104 is capable of rotating about a second axis of rotation formed by pins 708 and 712.

The rolling contact hinge of FIGS. 7 and 8 further includes a plurality of straps 714, 716, 718, and 720. An additional strap may be included adjacent to strap 716 on the opposite side of strap 718, but is not pictured so as to avoid obscuring the view of other components. In the example shown, the number of straps is for purposes of illustration only. In one or more embodiments, the straps may be narrower in width thereby allowing more straps to be included. In one or more embodiments, fewer straps may be used. For example, two straps may be used. Straps 714-720 are interleaved and provide for motion control as described herein in greater detail in connection with FIG. 8.

In one or more embodiments, straps 714-720 are implemented as a flexible material. In an example, straps 714-720 are implemented as a flexible film. Example materials from which straps 714-720 may be implemented include, but are not limited to, plastic, fabric, or other suitable materials.

As pictured, each strap is attached to a first surface of portion 102 and an opposing surface of portion 104. In FIG. 7, for example, device 100 is in an open position with an angle of approximately 180 degrees. As shown, strap 714 has a first end attached to surface 112 (bottom) of portion 104 and a second end attached to surface 108 (top) of portion 102. Strap 716 has a first end attached to surface 110 (top) of portion 104 and a second end attached to surface 106 (bottom) of portion 102. Strap 714 and strap 716 cross one another when viewed from the side of device 100. Strap 718 is attached the same way that strap 714 is attached. Strap 720 is attached the same way that strap 716 is attached. Thus, straps 714-720 effectively alternate in the way in which each strap attaches to portion 102 and 104 of device 100.

The terms "top" and "bottom," at least with reference to attachment of straps, are used in reference to the particular orientation and angle of rotation of device 100 shown in FIG. 7. When device 100 is in a closed position, for example (as pictured in FIG. 3), surface 106 is facing outward as is surface 112, with surfaces 108 and 110 in contact with one another. Thus, the particular surface considered the "top" or "bottom" depends upon the angle of rotation of the hinge mechanism formed by portion 102 and portion 104.

In the example of FIGS. 7 and 8, springs 722 and 724 are included. Springs 722 and 724 may be implemented as torsional coil springs that are capable of providing the force necessary for device 100 to open automatically. A damper 726 is included. Damper 726 may be implemented as a cylindrical damper. In the example shown, pin 708 extends through damper 726. Damper 726 controls the rate at which device 100 opens from the force provided by springs 722 and 724.

In particular embodiments, pin 706 is fixedly attached, or part of, linkage 702. Pin 710 is fixedly attached, or part of, linkage 704. For example, pin 706 may be integrated into linkage 702. Pin 710 can be integrated into linkage 704. As an illustrative and non-limiting example, pin 706 (710) and linkage 702 (704) can be a single, unified structure. Pin 708 is received by an aperture or hole in linkage 702. For example, pin 708 may snap into position as received by linkage 702. Further, pin 708 passes through spring 722 and damper 726. Pin 712 is received by an aperture or hole in linkage 704. For example, pin 712 may snap into position as received by linkage 704. Further, pin 712 passes through spring 724.

FIGS. 8-1, 8-2, 8-3, 8-4, and 8-5, taken collectively, illustrate the action of the rolling hinge as device 100 is opened. As device 100 opens (e.g., or closes), one strap (or set of straps) unwinds, while the other strap (or set of straps) winds, thereby maintaining a substantially constant length relationship and ensuring synchronous movement. Because the two straps (or two sets of straps e.g., where straps 714 and 718 form one set and straps 716 and 720 form another set) do not change in length and lay flat on the hemi-cylindrical surfaces of portions 102 and 104, the straps do not allow the hemi-cylindrical surfaces to slip relative to each other. The hemi-cylindrical surfaces of portions 102 and 104 are constrained to roll in the same way that two meshing gears are constrained. As such, straps 714-720 exhibit a gear-like behavior. The rigid link provided by linkages 702 and 704 prevents portions 102 and 104 from separating. Straps 714-720 also help to prevent portions 102 and 104 from separating.

FIGS. 8-1 through 8-5 illustrate that straps 714-720 facilitate rolling contact between the end of portion 102 and the end of portion 104. While the two ends of portions 102 and 104 roll about one another, neither end comes into direct contact with the other since the straps 714-720 are between the ends to facilitate smooth and synchronized rolling. Each of the ends 304 and 306 of portion 102 and portion 104, respectively, that abut are rounded or curved to facilitate smooth rolling contact throughout the 360 degrees of rotation provided. Ends 304 and 306 may have the same curvature to facilitate a smooth rolling effect. As discussed, in one or more embodiments, end 304 of portion 102 and end 306 of portion 104 may be hemi-cylindrical. Accordingly, in the example of FIGS. 8-1 through 8-5, strap 714 is unwinding from portion 104, while strap 716 is winding around portion 104.

In one or more embodiments, linkages 702 and 704 are configured to allow electrical wires to pass through. For example, one or more wires carrying power and/or data signals may be routed through either one or both of linkages 702 and 704. Thus, data signals and/or power signals are able to pass from electronics within portion 102 to electronics within portion 104. In particular embodiments, one linkage is capable of carrying power signals, while the other linkage is capable of carrying data signals. In particular embodiments, one or both of linkages 702 and/or 704 are capable of carrying both data signals and power signals.

In one or more embodiments, straps 714-720 are configured to include wires carrying data signals and/or power signals. As an illustrative and non-limiting example, one or more or all of straps 714-720 may be implemented using flexible circuitry. In another illustrative and non-limiting example, straps 714-720 may be implemented using fabric or flexible plastic where one or more wires are attached (e.g., glued or bonded) to the fabric and/or flexible plastic.

Figure 9:
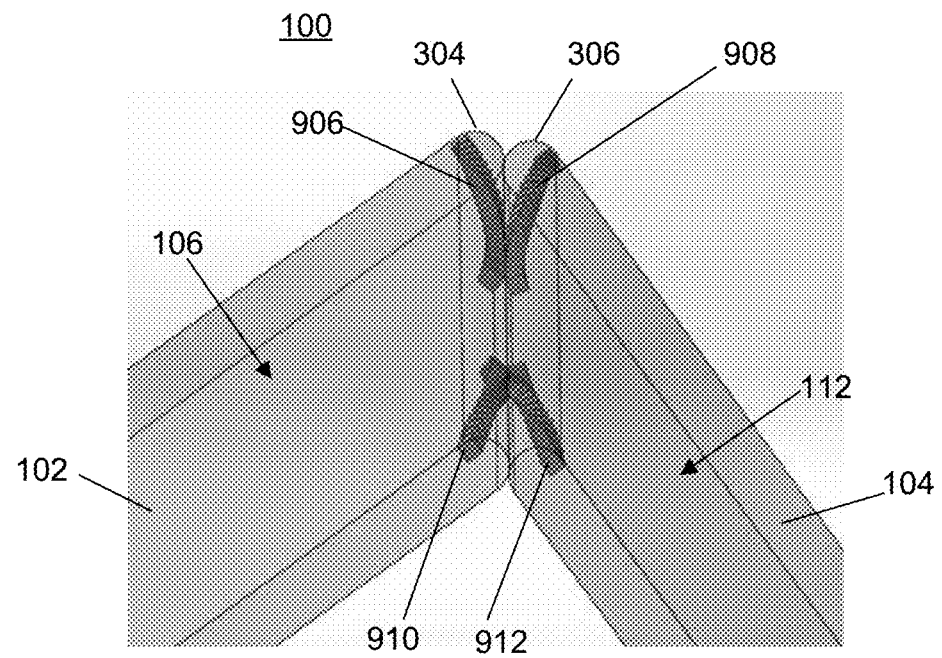
FIG. 9 illustrates a perspective view of a device including another example hinge mechanism.

FIG. 9 illustrates a perspective view of device 100 including another example hinge mechanism. In the example of FIG. 9, the hinge mechanism is a magnetic rolling contact hinge. Referring to FIG. 9, portion 102 has a rounded end 304. Portion 104 has a rounded end 306. In the example of FIG. 9, rounded ends 304 and 306 have the same curvature to facilitate a smooth rolling effect. For example, rounded ends 304 and 306 each may be hemi-cylindrical.

Portion 102 includes a magnet array 906 and a magnet array 910. Portion 104 includes a magnet array 908 and a magnet array 912. Each magnet array may be formed of a plurality of magnets arranged adjacent to one another as pictured. In one or more embodiments, magnet arrays 906-912 are arranged in a helix or partial helix formation. For example, magnet array 906 and magnet array 910 each is arranged as a right-handed helix. Magnet array 908 and 912 each is arranged as a left-handed helix. Magnetic arrays 906-912 may be fixedly attached to ends 304 and 306 using an adhesive or other suitable attachment mechanism.

Rounded end 304 and rounded end 306 are able to roll about one another while maintaining synchronization using magnet arrays 906-912. For example, magnet array 906 and magnet array 908 may be aligned so that opposite poles align across from one another as the rolling motion occurs. Similarly, magnet array 910 and magnet array 912 may be aligned so that opposite poles align across from one another as the rolling motion occurs.

In the example of FIG. 9, magnetic arrays 906-910 are provided for synchronizing rotation of portions 102 and 104. It should be appreciated that further structure such as linkages (with pins), dampers, and springs as described with reference to FIGS. 7 and 8 may also be included. As an illustrative and non-limiting example, magnetic arrays 906-910 may be used in place of the straps in the examples of FIGS. 7 and 8 to implement a magnetic rolling contact hinge for device 100. In one or more other embodiments, magnet arrays 906-910 may also provide damping so that a separate or discrete damper is not required.

Figure 10:
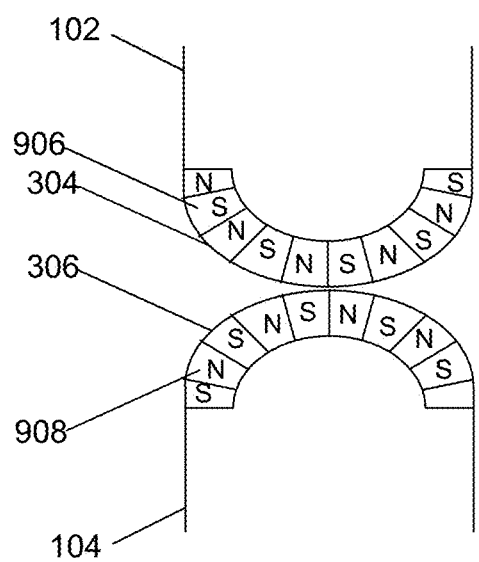
FIG. 10 is a cross-sectional side view of the device of FIG. 9.

FIG. 10 is a cross-sectional side view of the device of FIG. 9. FIG. 10 illustrates an example implementation of the magnet arrays of FIG. 9. In the example of FIG. 10, portions 102 and 104 are shown in cross-section. As rounded end 304 and rounded end 306 roll on one another, magnetic array 906 aligns with magnet array 908 so that north poles of magnet array 906 are aligned with south poles of magnet array 908. Similarly, south poles of magnet array 906 are aligned with north poles of magnet array 908.

Figure 11:
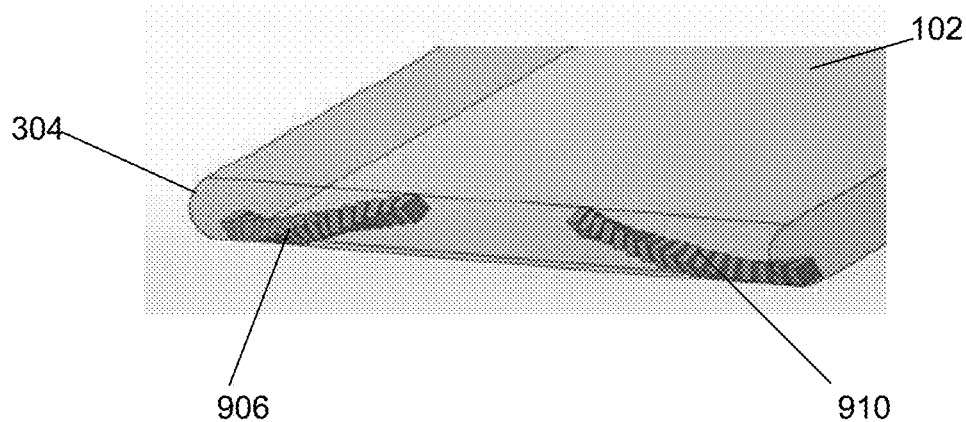
FIG. 11 is a perspective view of a portion of the device of FIG. 9.

FIG. 11 is a perspective view of portion 102 and magnet arrays 906 and 910. FIG. 11 illustrates the helix shape formed by magnet arrays 906 and 910 within portion 102.

Figure 12:
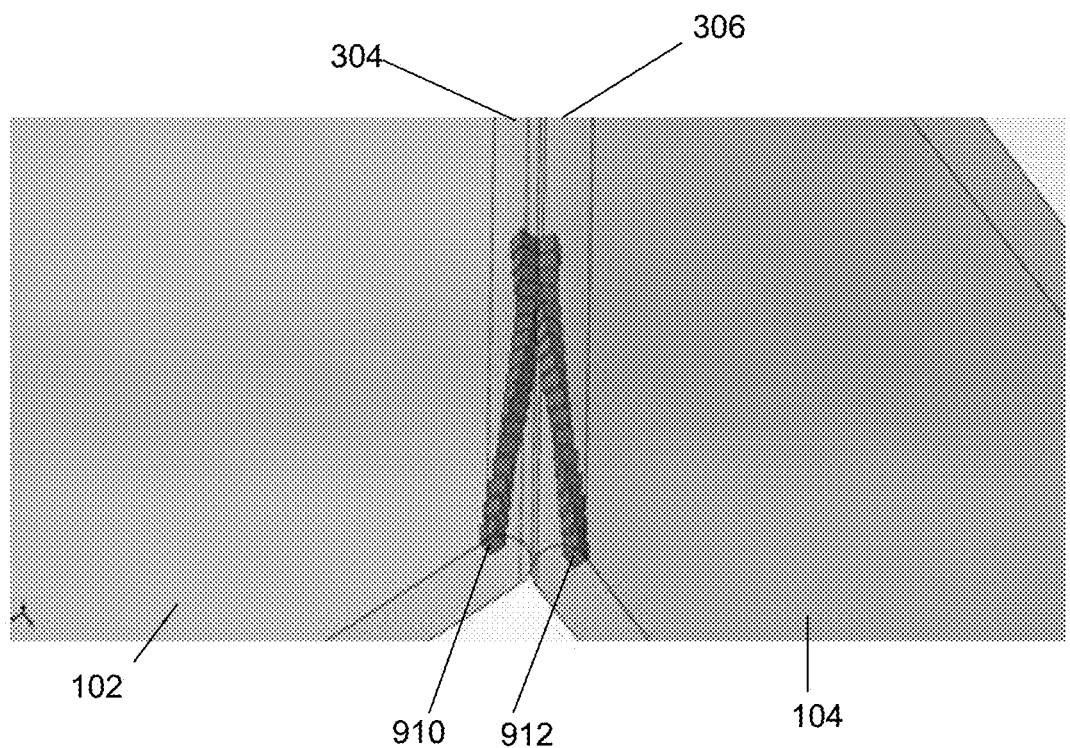
FIG. 12 illustrates rolling action of the device of FIG. 9 using the example magnetic rolling contact hinge.

FIG. 12 illustrates rolling action facilitated by the magnetic rolling contact hinge. In the example of FIG. 12, magnet array 910 and magnet array 912, each being at least partially helical and being opposite in terms of handedness, facilitate synchronization of portion 102 and portion 104 as rounded ends 304 and 306 roll about one another.

In the example embodiments illustrated in FIGS. 9-12, it should be appreciated that rounded ends 304 and 306 of portion 102 and portion 104, respectively, are made using a magnetically permeable material. In one or more embodiments, rounded ends of portions 102 and 104 are made of a non-ferrous material. In one or more embodiments, rounded ends of portions 102 and 104 are made of other materials such as, for example, plastics, glass, aluminum, polychlorinated biphenyl (PCB), or other suitable materials.

In the examples described in connection with FIGS. 9-12, the magnets in each of the magnet arrays are arranged adjacent to one another. For example, the magnets in magnet array 910 abut one another. Further, the particular shape of each magnet array need not be a helix or partial helix. In one or more other embodiments, magnets of a magnet array may be spaced apart within approximately 20-30 degrees of rotation so long as magnets in magnet array 910 (906) are paired with magnets in magnet array 912 (908), e.g., with opposing poles, so that magnets on one side (e.g., in one portion) are looking for a paired magnet on the other side (e.g., in the other portion).

In one or more other embodiments, each of magnet arrays 906-912 may be implemented as a polymagnet as opposed to an array of discrete magnets. In particular embodiments, a strip corresponding to the surface of attachment of each of magnet arrays 906-912 on rounded edges 902 and 904 may be magnetized as a polymagnet to provide the synchronization described. As such, separate magnetic structures are not needed since portions or strips of rounded ends 304 and 306 are capable of being magnetized as polymagnets to perform the functionality described in connection with FIGS. 9-12 to facilitate the rolling contact described.

Figure 13:
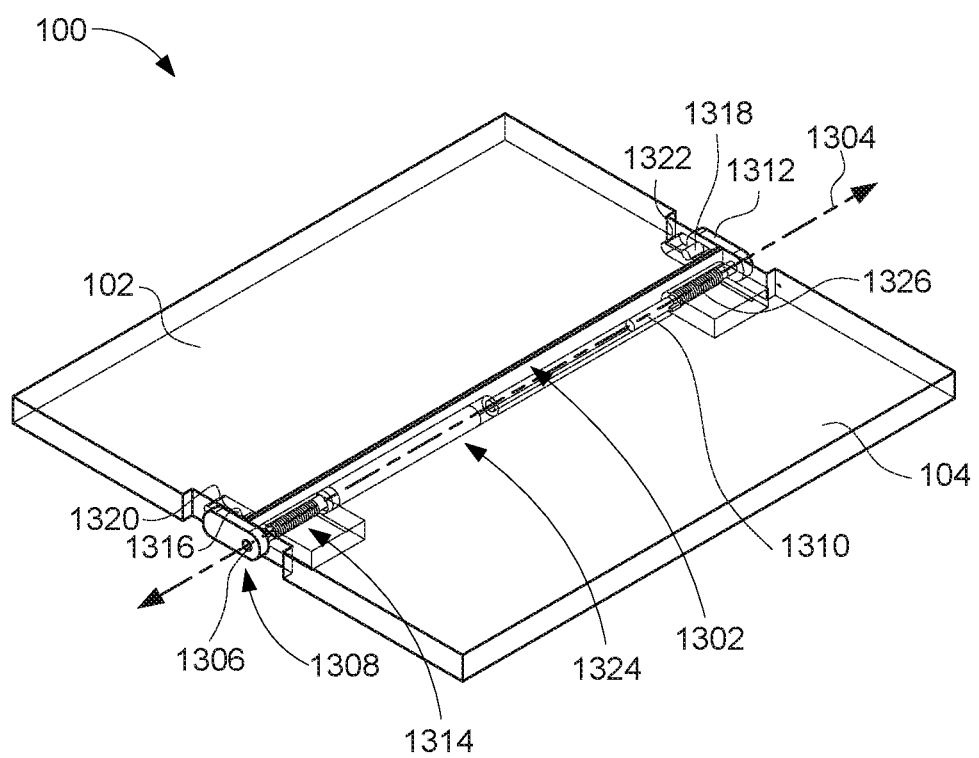
FIG. 13 is a perspective cutaway view of a device including another example hinge mechanism.

FIG. 13 is a perspective cutaway view of device 100 including another example hinge mechanism. In the example of FIG. 13, the hinge mechanism is implemented as a film hinge. In the example of FIG. 13, portion 102 is coupled to portion 104 by a film 1302. In one or more embodiments, film 1302 is pleated. For example, film 1302 may have one or more folds. The folds, or pleats, are parallel to an axis of rotation 1304 about which portion 102 rotates. Linkage 1308 has a pin 1306 and a pin 1316. Linkage 1312 has a pin 1310 and pin 1318. Linkage 1308 and 1312 may be implemented substantially similar to linkages 702 and 704, respectively, of FIGS. 7 and 8. In the example of FIG. 13, however, pins 1316 and 1318 slide within slots 1320 and 1322, respectively.

Pin 1306 passes through spring 1314. In one or more embodiments, pin 1306 passes through damper 1324. In particular embodiments, pin 1306 passes at least partially through damper 1324. Damper 1324 may be implemented as a cylindrical damper. Pin 1310 passes through spring 1326. Springs 1314 and 1326 may be implemented as torsional coil springs. As pictured, pins 1306, spring 1314, damper 1324, spring 1326, and pin 1310 are aligned along axis of rotation 1304. Portion 104 is capable of rotating around axis of rotation 1304. Portion 102 is capable of rotating around a second axis of rotation aligned with pins 1316 and 1318.

Linkage 1308 is coupled to pin 1316. In an embodiment, pin 1316 is attached to linkage 1308. In another embodiment, linkage 1308 is formed with pin 1316 as an integrated part of linkage 1308, e.g., as a single, unified structure. Linkage 1312 is coupled to pin 1318. Linkage 1312 may be coupled to pin 1318 as described in connection with linkage 1308 and pin 1316. Pin 1316 is inserted into a slot 1320 positioned along a side of portion 102. Pin 1318 is inserted into a slot 1322 positioned along a side of portion 102 opposing the side with slot 1320.

In the example of FIG. 13, the film hinge is opened, e.g., powered, by springs 1314 and/or 1326. Springs 1314 and 1326 are capable of providing the force used to automatically open device 100. Damper 1324 provides dampening and is capable of controlling the rate at which device 100 opens. In one or more embodiments, film 1302 is folded into layers to allow approximately 180 degree or 360-degree rotation. As illustrated, one side of each of linkages 1308 and 1312, e.g., pins 1316 and 1318, slide in slots 1320 and 1322, respectively, while device 100 opens and/or closes. Pins 1316 and 1318, for example, slide in slots 1320 and 1322 due to the changes in distance created by portion 102 rotating around an axis that is removed from the plane of the linkage, e.g., axis of rotation 1304.

FIGS. 14-1 through 14-6 are cross-sectional side views of the device of FIG. 13 that, taken collectively, illustrate 360-degree rotation using the film hinge. In FIG. 14-1, device 100 is in a closed position. In the closed position, film 1302 has a fold 1402. Fold 1402 has an angle of approximately zero degrees. Linkage 1308 is oriented with an angle of approximately 45 degrees relative to portion 104. Pin 1316 (not shown) of linkage 1308 is toward the far right of slot 1320.

In FIG. 14-2, device 100 begins to open. As pictured, pin 1316 of linkage 1308 has slid from one end of slot 1320 to the other end. Further, film 1302 develops a second fold 1404. The angle of fold 1404 in FIG. 14-2 is greater than 90 degrees.

FIGS. 14-3 and 14-4 illustrate continued rotation of portion 102 about axis of rotation 1304 (not shown), which corresponds to pin 1306. As illustrated, the size of the angle of fold 1404 has reduced from FIG. 14-2 to FIG. 14-3 and continues to become smaller to virtually zero degrees in FIG. 14-4. The angle of fold 1402 begins to increase in FIG. 14-4.

In FIG. 14-5, the angle of fold 1402 continues to increase. Further, pin 1316 (not shown) of linkage 1308 remains in the same position in slot 1320 as in each of FIGS. 14-2-14-3, and 14-4.

In FIG. 14-6, the angle of fold 1402 increases to approximately 180 degrees and is therefore not visible as a fold. In FIG. 14-6, device 100 is completely open. Whereas surfaces 106 and 112 of portions 102 and 104, respectively, are facing outward when device 100 is in the closed position in FIG. 14-1, surfaces 106 and 112 are in contact with one another in the fully open position of FIG. 14-6. Similarly, while surfaces 108 and 110 are in contact with one another when device 100 is in the closed position illustrated in FIG. 14-1, surfaces 108 and 110 are facing outward, e.g., in opposite directions, when device 100 is in the fully open position illustrated in FIG. 14-6.

In one or more embodiments, film 1302 is made of a plastic material. The plastic material may be one that is suitable for being drawn into films. The plastic material may be highly cyclable. In one example, film 1302 may be made of polypropylene. In one or more embodiments, film 1302 is made of a fabric.

In one or more embodiments, electrical signals may be routed from electronics located in portion 102 to electronics in portion 104 using wires that flow through linkage 1308 and/or linkage 1312. In one or more embodiments, electrical signals may be conveyed wirelessly between electronics in portion 102 and electronics in portion 104.

Figure 15:
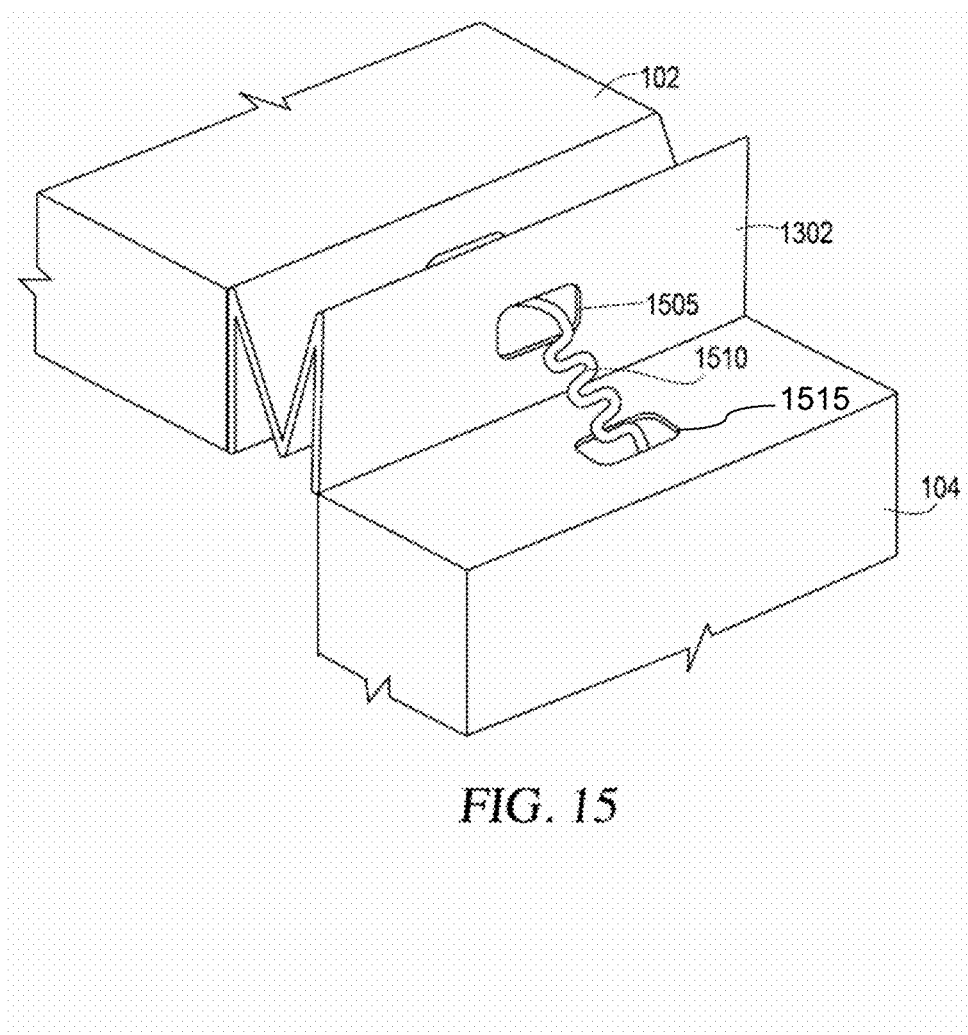
FIG. 15 illustrates a perspective view of a device with another example film hinge.

FIG. 15 illustrates a perspective view of device 100 with another example film hinge. In the example of FIG. 15, springs, dampers, and linkages are not shown. FIG. 15 illustrates an example embodiment in which apertures 1505 are created within the folds of film 1302 to allow one or more wires 1510 to pass from electronics in portion 102 to electronics located in portion 104. In one or more embodiments, wires 1510 are implemented as a ribbon cable. As pictured, each of portions 102 and 104 may also have an aperture 1515 or opening through which wires 1510 are able to pass. In one or more embodiments, openings in portions 102 and 104 through which wire 1510 passes may have a gasket, a membrane, or other material sealing the opening. As such, aperture 1515 in portions 102 and 104 through which wire 1510 passes may be waterproof or substantially waterproof.

Figure 16:
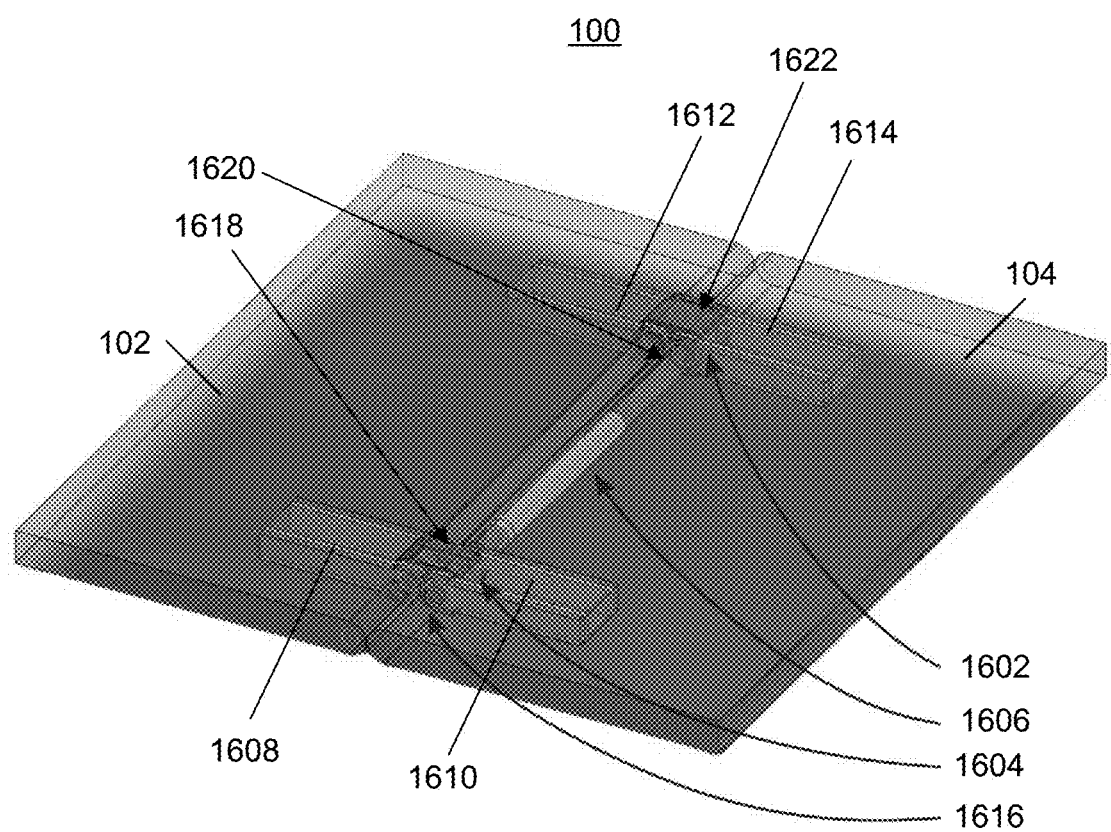
FIG. 16 is a perspective cutaway view of a device including another example hinge mechanism.

FIG. 16 is a perspective cutaway view of device 100 including another example hinge mechanism. In the example of FIG. 16, the hinge mechanism is a geared hinge. In the example of FIG. 16, device 100 includes linkage 1602, linkage 1604, a damper 1606, springs 1608, 1610, 1612, and 1614, and motion control gears 1616, 1618, 1620, and 1622. Damper 1606 is implemented as a cylindrical damper. Springs 1608, 1610, 1612, and 1614 may be implemented as torsional coil springs.

In one or more embodiments, motion control gears 1616, 1618, 1620, and 1622 are integrated into portion 102 and portion 104 of device 100. For example, rather than including gears within linkages 1602 and/or 1604, gearing may be incorporated into portions 102 and 104 themselves.

Figures 1, 17:
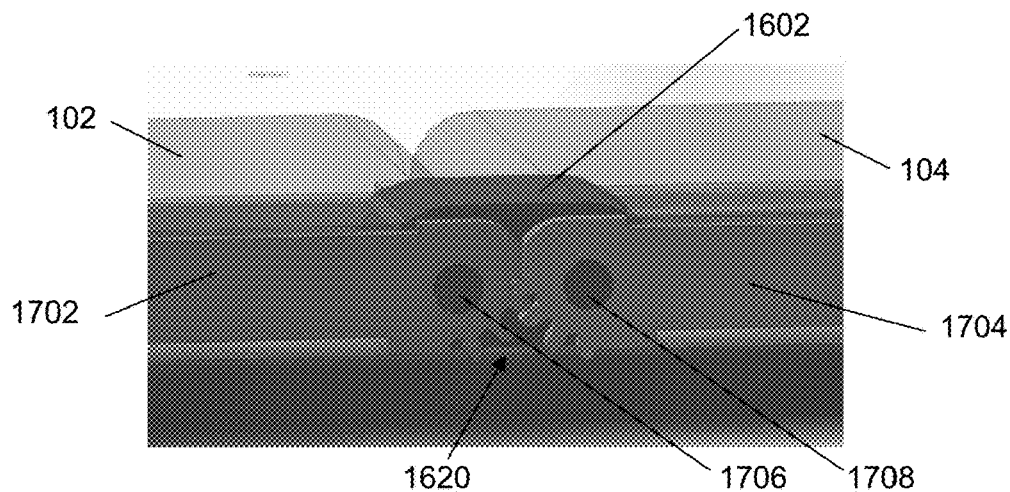
Figures 2, 17:
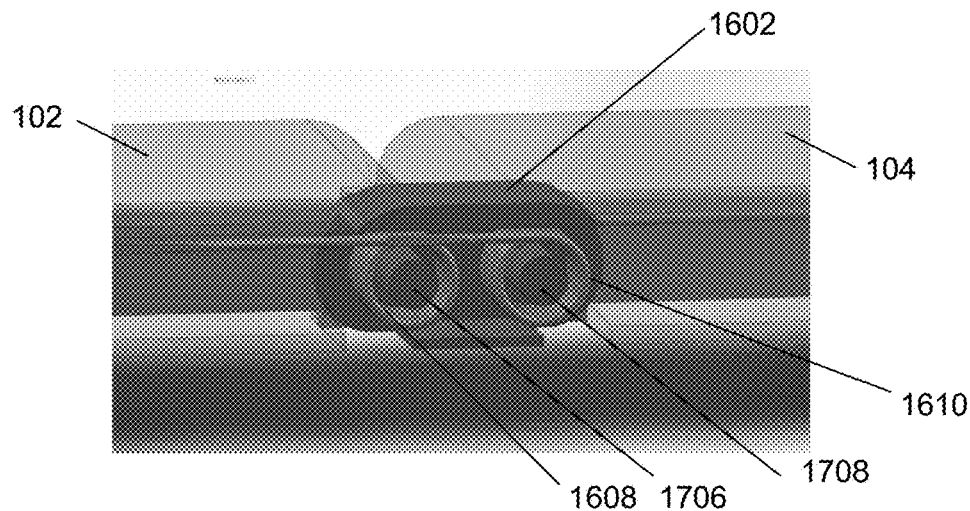

FIGS. 17-1 through 17-2 are perspective cutaway views illustrating the example geared hinge of FIG. 16. Referring to FIGS. 17-1 and 17-2, motion control gears 1620 are shown. In the example of FIG. 17-1, device 100 is in an open position with an angle of approximately 180 degrees. Motion control gears 1620 include a plurality of geared members. For example, motion control gears 1620 include a geared member 1702 and a geared member 1704. Geared member 1702 includes an arm that extends into portion 102. Geared member 1704 includes an arm that extends into portion 104. Geared member 1702 and geared member 1704 each include teeth, or gears, that cooperatively engage one another to synchronize motion of portions 102 and 104 when device 100 opens and closes.

In the example of FIG. 17-1, geared members 1702 and 1704 are shown. In one or more embodiments, another set of geared members may be located on the far side of linkage 1602. Referring to FIG. 16, for example, each of linkages 1602 and 1604 can include a pair of geared members 1702, 1704 on each side to facilitate synchronized and steady opening and closing of device 100.

In one or more embodiments, the arm of geared member 1702 is fixedly attached to portion 102. Similarly, the arm of geared member 1704 is fixedly attached to portion 104. In one or more embodiments, geared member 1702 is an integrated part of portion 102 and geared member 1704 is an integrated part of portion 104. In one or more embodiments, the arm of geared member 1702 extends into and is received by a cavity of portion 102 providing a snug and/or secure fit therein. Similarly, the arm of geared member 1704 extends into and is received by a cavity of portion 104 providing a snug and/or secure fit therein. In any case, geared members 1702 and 1704 synchronize movement of portions 102 and 104 as device 100 opens and closes.

Linkage 1602 includes two pins 1706 and 1708. In one or more embodiments, pins 1706 and 1708 are formed as part of linkage 1602. For example, pins 1706 and 1708 are fixedly attached to linkage 1602 so as not to rotate. In one or more embodiments, pins 1706 and 1708 are capable of rotating within linkage 1602. As shown, geared member 1702 includes an aperture that is configured to receive pin 1706. Geared member 1704 includes an aperture that is configured to receive pin 1708.

FIG. 17-2 illustrates an example implementation of linkage 1602. As pictured, linkage 1602 is substantially hollow and includes pins 1706 and 1708 extending therethrough to engage geared members 1702 and 1704 (not shown). As pictured, spring 1608 is wound around pin 1706. Spring 1610 is wound around pin 1708. Spring 1608 extends into portion 102. Spring 1610 extends into portion 104. Springs 1608, 1610, 1612, and 1614 provide the force necessary to automatically open device 100.

Figure 18:
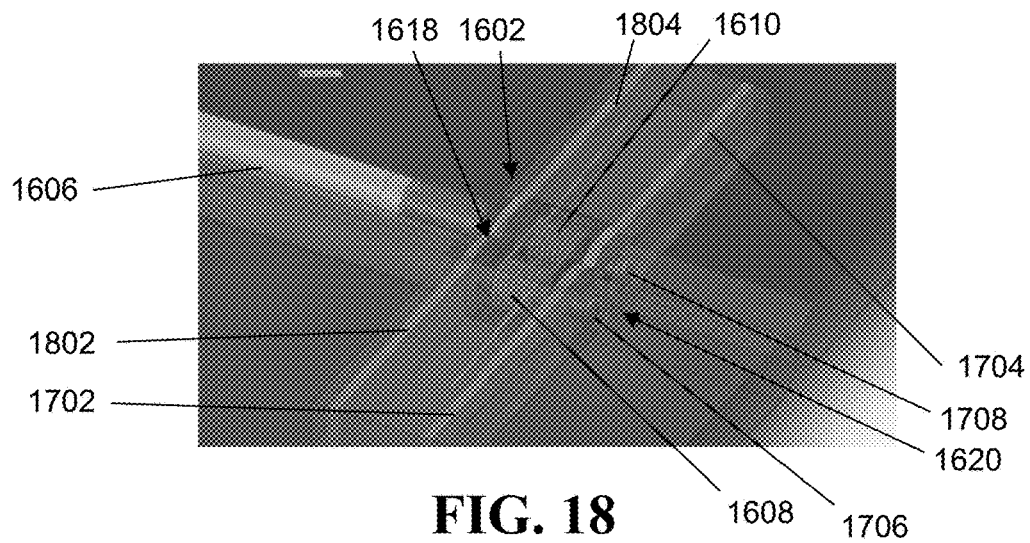
FIG. 18 is a perspective cutaway view of the example geared hinge of FIG. 16.

FIG. 18 illustrates a cut-away perspective view of the example geared hinge of FIG. 16. FIG. 18 illustrates a close-up view of the contents within linkage 1602. In the example of FIG. 18, linkage 1602 is located between motion control gears 1616 and 1618. In this regard, pin 1806 extends through linkage 1602 to be received by each of geared members 1702 and 1802. Pin 1708 extends through linkage 1602 to be received by each of geared members 1804 and 1704. In the examples of FIGS. 16, 17, and 18, pin 1706 is aligned with a first axis of rotation, while pin 1708 is aligned with a second axis of rotation. In the example of FIG. 18, pin 1708 may extend past geared member 1804 and extend through or partially through or connect to damper 1606. Damper 1606 is capable of controlling the rate at which device 100 opens by countering the force provided by the springs. As pictured, the arms of the geared members extend into a cavity in each respective portion as does each end of springs 1610 and 1608. The structure of linkage 1604 (e.g., geared members, springs, and pins) may be implemented substantially similar to the example of linkage 1602 described in connection with FIG. 18.

Figure 19:
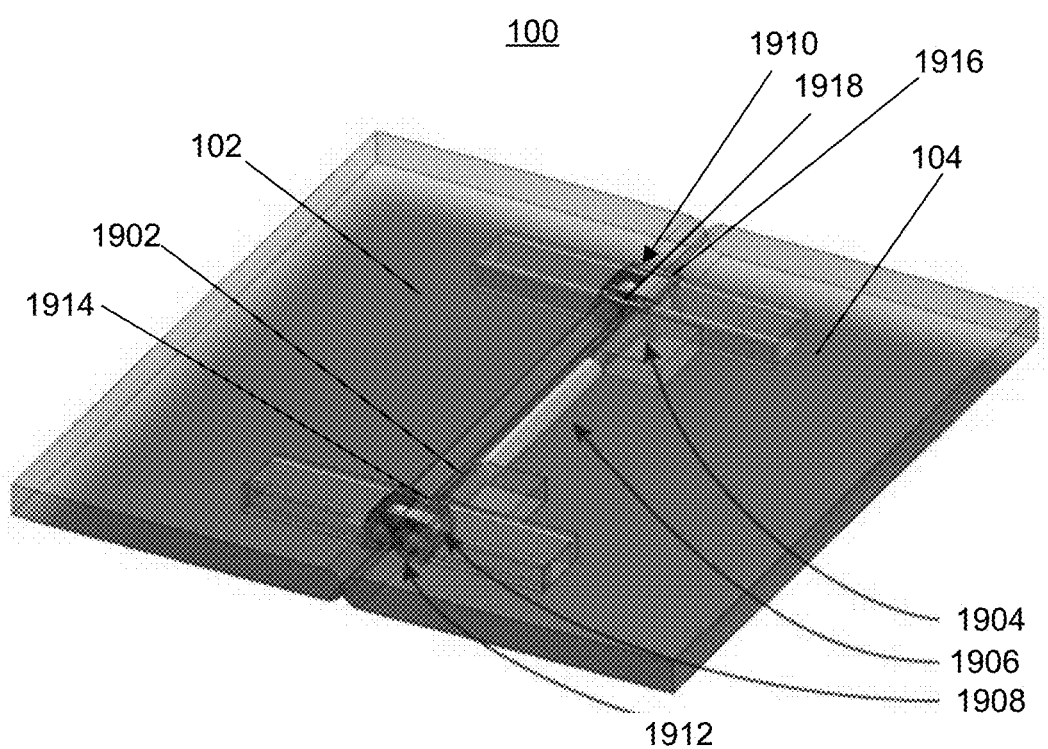
FIG. 19 is a perspective cutaway view of a device including another example geared hinge.

FIG. 19 is a perspective cutaway view of a device including another example geared hinge. The geared hinge illustrated in FIG. 19 is substantially similar to the embodiments described in connection with FIG. 16. In the example of FIG. 19, a belt drive mechanism is used in place of the linkage and spring assembly. In the example of FIG. 19, device 100 includes springs 1902 and 1904, a damper 1906, belt and pulley assemblies 1908 and 1910, and motion control gears 1912 and 1914. Damper 1906 is implemented as a cylindrical damper. Damper 1906 is capable of controlling the rate at which device 100 opens. Springs 1902 and 1904 may be implemented as torsional coil springs. In the example of FIG. 19, device 100 is in an open position with an angle of approximately 180 degrees between portion 102 and portion 104.

Figures 1, 20:
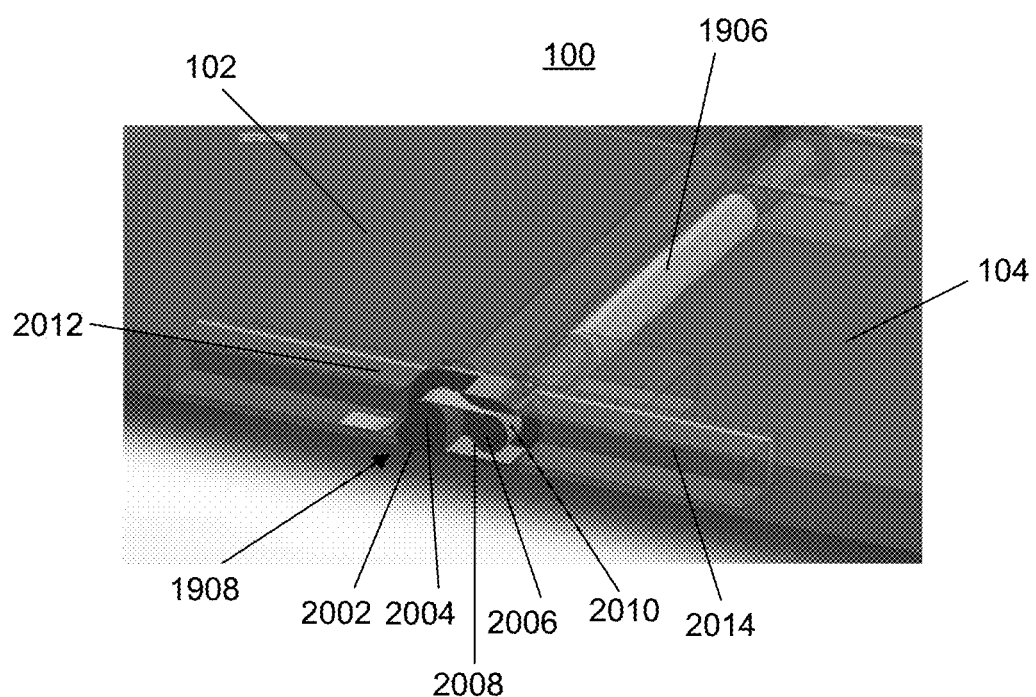
Figures 2, 20:
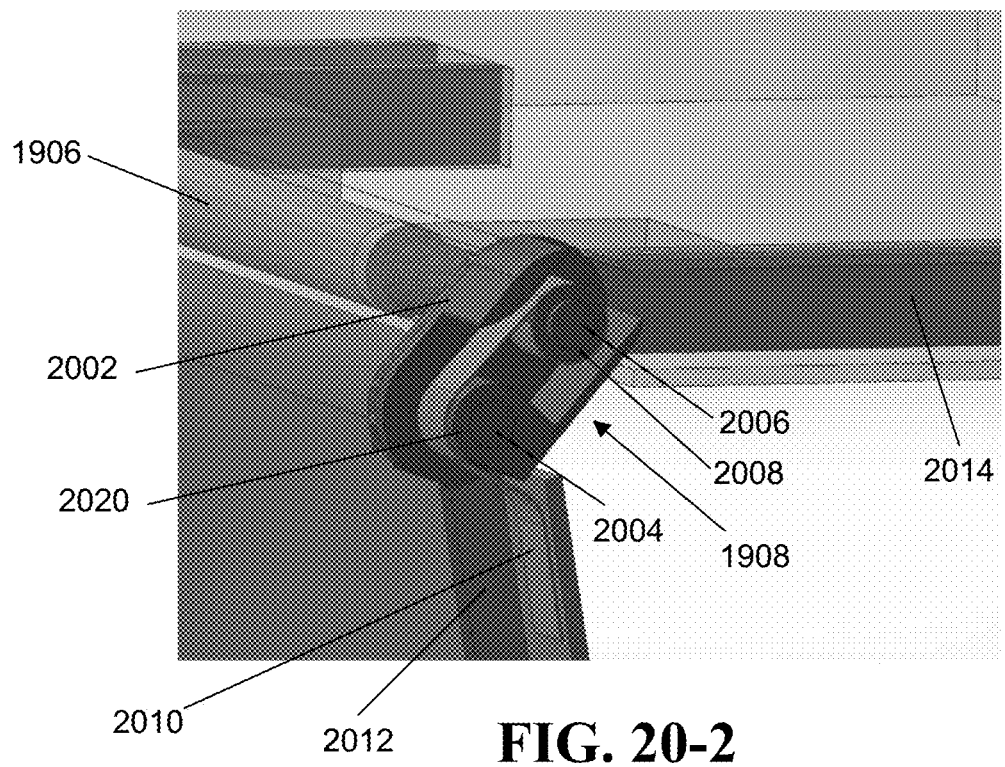
Figures 3, 20:
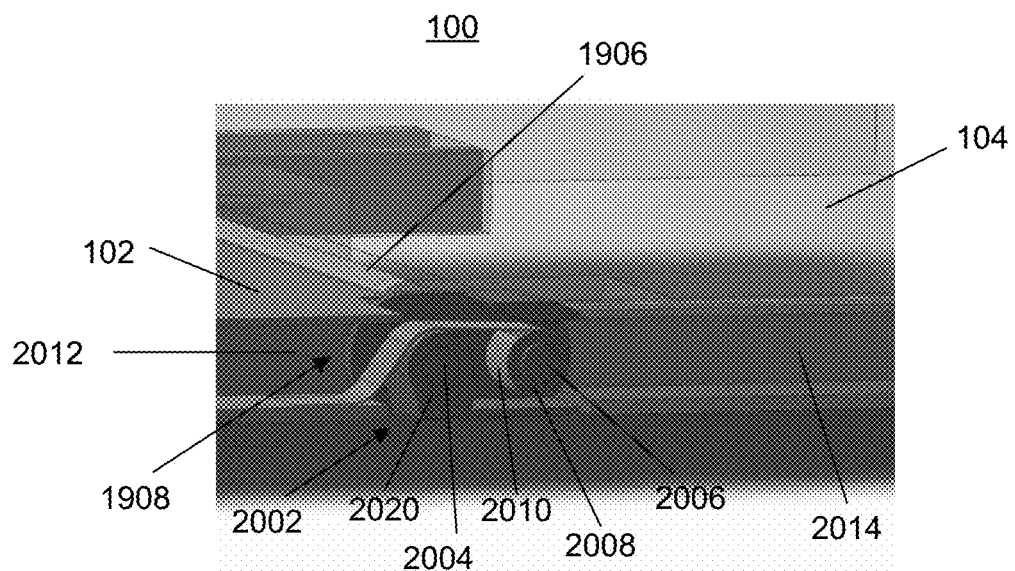
Figures 4, 20:
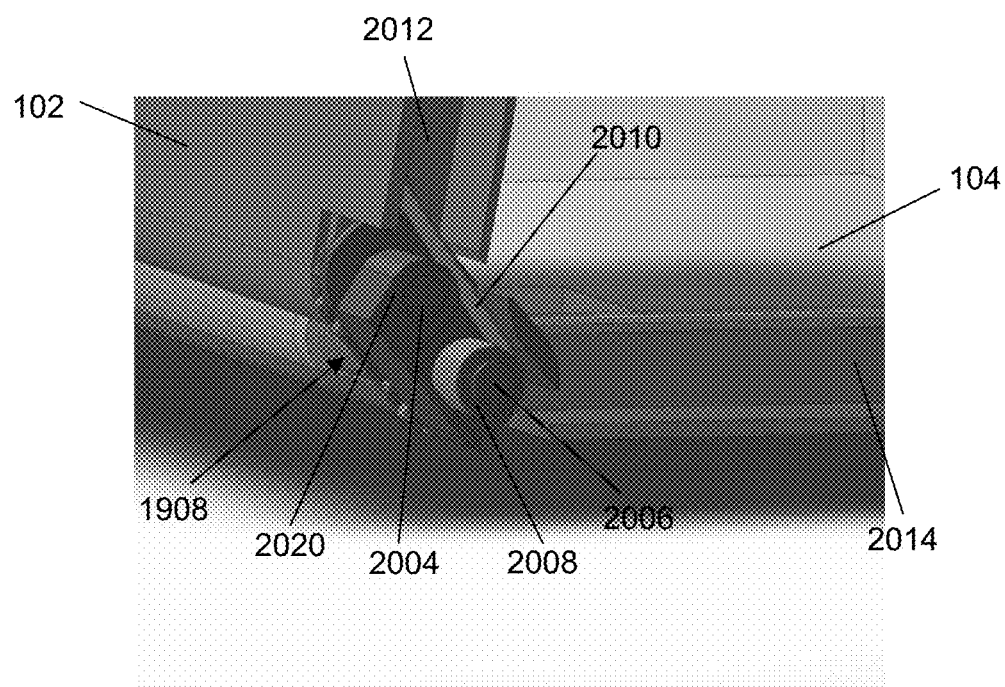

FIGS. 20-1 and 20-4 are perspective cutaway views of the geared hinge of FIG. 19. Referring to FIG. 20-1 through 20-4, belt and pulley assembly 1908 has a casing 2002 and pins 2004 and 2006. Pin 2004 is aligned with a first axis of rotation. Pin 2006 is aligned with a second axis of rotation. Belt and pulley assembly 1908 includes a drive wheel 2008, a pulley 2020, and a belt 2010. A first end of belt 2010 is attached to drive wheel 2008. Drive wheel 2008 is coupled to pin 2006. A second end of belt 2010 is attached to the inner portion of the channel of portion 102. Belt 2010 bends around pulley 2020, which is coupled or mounted to pin 2004. In one or more embodiments, drive wheel 2008 is fixed to pin 2006. Springs 1902 and 1904 provide the force that automatically opens device 100. Drive wheel 2008 is configured to wind belt 2010 as device 100 closes and unwind belt 2010 as device 100 opens. In the example of FIG. 20, device 100 further includes geared members 2012 and 2014 as described with reference to FIG. 16, though the geared members are at least partially obscured by belt and pulley assembly 1908. As illustrated in FIG. 20-2, device 100 is capable of rotating beyond 180 degrees. As noted, device 100 is capable of 360-degree rotation.

The examples of FIGS. 20-3 and 20-4 illustrate the closing action of device 100. In the examples of FIGS. 20-3 and 20-4, device 100 closes as drive wheel 2008 winds belt 2010. Belt 2010 moves around pulley 2020 and, as illustrated in FIG. 20-4, no longer contacts pulley 2020 when device 100 is moved into the closed position or an angle formed by portions 102 and 104 of approximately less than 90 degrees.

Figure 21:
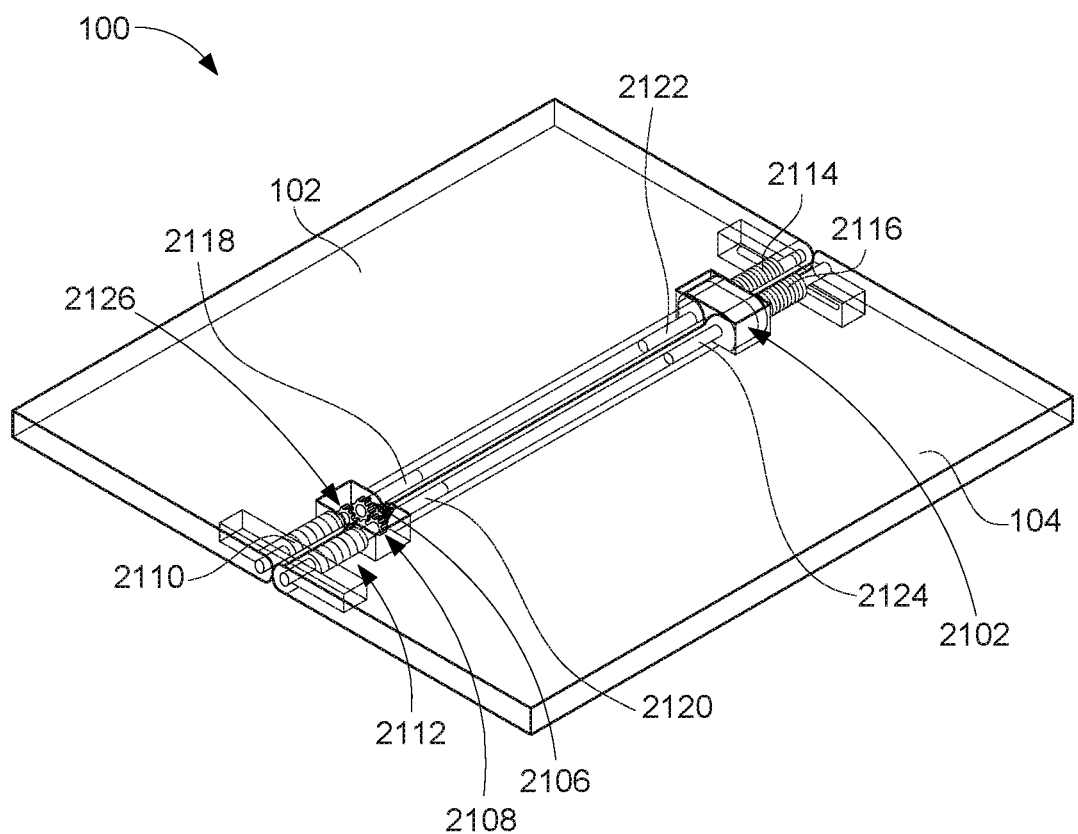
FIG. 21 illustrates a perspective cutaway view of device including another example geared hinge.

FIG. 21 illustrates a perspective cutaway view of device 100 including another example geared hinge. The geared hinge illustrated in FIG. 21 utilizes a linkage with integrated gears. In one or more embodiments, the linkage is operable to provide damping through the inclusion of a fluid. As pictured, device 100 includes linkage 2102 and linkage 2104. In FIG. 21, linkage 2104 is removed in order to better illustrate the elements included within the linkage. Each of linkages 2102 and 2104 includes motion transfer gears 2106 and fixed gears 2108 and 2126. Further, the geared hinge includes springs 2110, 2112, 2114, and 2116.

The geared hinge includes a pin 2118 that extends through linkage 2104 and spring 2110. Pin 2120 extends through linkage 2104, spring 2112, and fixed gear 2108. Pin 2122 extends through linkage 2102 and spring 2114. Pin 2124 extends through linkage 2102 and spring 2116. The geared hinge is powered by springs 2110-2116. For example, springs 2110 and 2114 may be torsional coil springs that provide rotational force for portion 102 to rotate around an axis of rotation aligned with pins 2118 and 2122. Springs 2112 and 2116 may be torsional coil springs that provide rotational force for portion 104 to rotate around an axis of rotation aligned with pins 2120 and 2124. Motion is controlled by motion transfer gears 2106 and fixed gears 2108 and 2126 within linkages 2102 and 2104. Motion transfer gears 2106 and fixed gears 2108 and 2126 synchronize the rotation between portion 102 and portion 104.

In one or more embodiments, linkages 2102 and 2104 each include a gear compartment. The gear compartment may be sealed and filled with a fluid and/or a heavy grease. By tuning fixed gears 2108 and 2126 and motion transfer gears 2106 in combination with the fluid and/or heavy grease, dampening action is provided that is capable of controlling the rate at which device 100 opens.

In one or more embodiments, one or both of linkages 2102 and 2104 may include a separate channel or pass-through (not shown) in a different plane than the sealed gear compartments. The channel may be sized to allow electrical wires or other connections to pass through from circuitry in portion 102 to circuitry in portion 104.

Figures 1, 22:
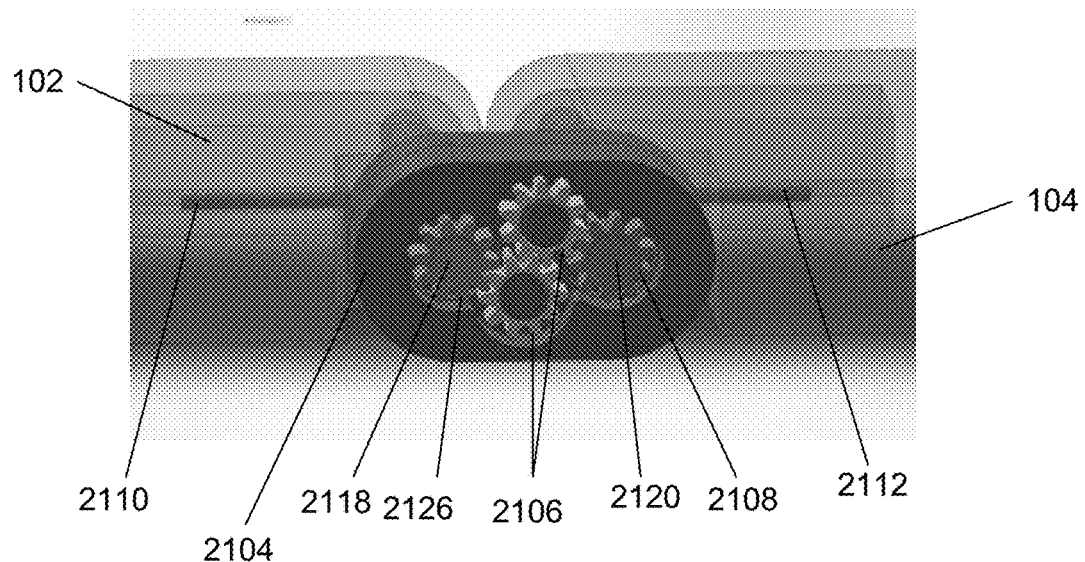
Figures 2, 22:
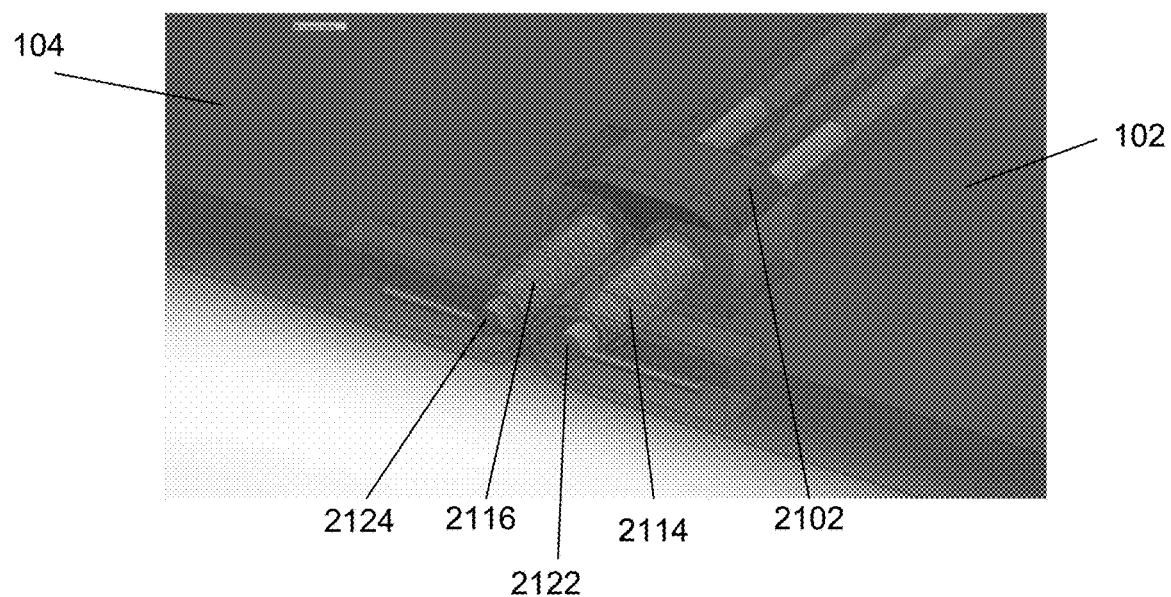

FIGS. 22-1 and 22-2 are perspective cutaway views of the example geared hinge of FIG. 21. Referring to FIGS. 22-1 and 22-2, pin 2118 extends through linkage 2104 and fixed gear 2126. Fixed gear 2126 engages with motion transfer gears 2106. Pin 2120 extends through linkage 2104 and fixed gear 2108. Fixed gear 2108 engages with motion transfer gears 2106.

Figure 23:
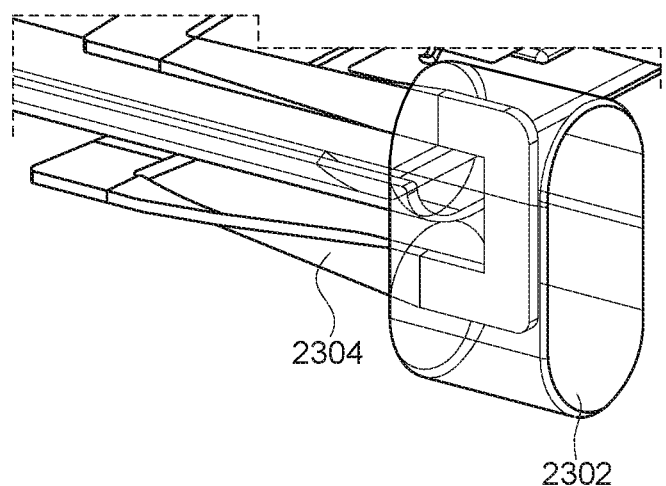
FIG. 23 is a perspective cutaway view illustrating another example hinge.

FIG. 23 is a perspective cutaway view illustrating another example hinge mechanism. As pictured, the hinge mechanism includes a housing 2302. In one or more embodiments, element 2304 is a ribbon cable illustrating one example for coupling circuitry in portion 102 with circuitry in portion 104.

In one or more other embodiments, element 2304 is a torsional leaf spring. As a torsional leaf spring, element 2304 is capable of providing force needed to open device 100. In the example of FIG. 23, other structures such as pins and dampers are not shown to more clearly illustrate element 2304. In particular embodiments, two or more of elements 2304 may be included and pass through housing 2302 where one or more of elements 2304 are torsional leaf springs and one or more of elements 2304 are ribbon cables. Thus, both a torsional leaf spring and a ribbon cable may pass through housing 2302 to provide communication between circuitry in portions 102 and 104 and also to provide force that automatically opens device 100.

In one or more embodiments, a torsional leaf spring as illustrated in FIG. 23 may be incorporated into device 100 in the example of FIGS. 1-6 where spine(s) are used. The torsional leaf spring (or springs) may be used to provide further rotational force for automatically opening device 100.

The example embodiments described herein can include a latch that keeps device 100 in the closed position until the latch is released. The latch may be implemented as any of a variety of different latch types. Example latch types include, but are not limited to, magnetic, electromagnetic, mechanical, magnetic/mechanical, and electromechanical. The particular type of latch included in device 100 is not intended to limit the example embodiments described herein.

In one or more embodiments, the latch is configured to release in response to successful user authentication. For example, device 100 may include a fingerprint sensor, voice/speaker recognition, eye/facial scanning, receive an input password or gesture via an externally accessible touch pad or touch sensitive surface, via near field communication (NFC) tag, or a handshake with another device such as a smart watch or another portable device or appliance.

An example of a magnetic latch may be implemented using printed magnets. A first magnet may be printed on surface 108 of portion 102 and a second magnet printed on surface 110 of portion 104. The two magnets may be located and/or positioned so as to come in contact with one another when device 100 is in the closed position. The poles of each printed magnet may be aligned when device 100 is in the closed position so as to attract one another thereby keeping device 100 in the closed position. The attractive force of the latch, for example, is sufficient to overcome the forces provided for automatic opening of the hinge mechanism and device 100.

One of the magnets may be printed on a surface or element that is configured to provide a small amount of movement. In response to movement of one of the printed magnets, e.g., when the latch is to open, the poles of the two printed magnets no longer align to provide attractive force and instead repel thereby releasing the latch. As an illustrative example, one of the magnets may be mechanically connected to a button or may be moved by a solenoid that is controlled by a manual control or a user authentication process (e.g., electronically).

The example embodiments described herein may include any of a variety of different types of dampers. In one or more embodiments, the dampers are passive mechanisms. Examples of passive dampers include hydraulic dampers (e.g., dampers that utilize oil) whether rotary or linear, and air dampers (e.g., linear). Other examples of passive dampers include miniature fly wheels, mechanical brakes, and patterned magnetic brakes.

In one or more embodiments, the dampers are active mechanisms. Examples of active mechanisms include magnetorheological fluid, solenoid clutch, and a motor and/or generator. A magnetorheological fluid, also referred to as a ferrofluid, may be used so that application of a magnetic field to the fluid changes the properties of the fluid to either increase or decrease damping. For example, a ferrofluid may be included within the linkages described with reference to FIGS. 21 and 22. Application of the magnetic field can increase and/or decrease damping. Increasing damping a sufficient amount allows the mechanism to provide one or more position stops. In the examples of FIGS. 21 and 22, a controller (e.g., a processor capable of executing program code or other suitable control circuitry) may be included that is capable of adjusting a magnetic field applied to the ferrofluid within the linkages so as to dynamically control damping and/or provide one or more position stops.

In particular embodiments, the controller is capable of controlling operation of an active damper used with the hinge mechanisms described herein. By controlling the amount of damping provided by an active damper such as a magnetorheological fluid, a solenoid clutch, a motor, or a generator, the controller is able to electronically control and vary the amount of damping provided. Thus, the damper is capable of providing a variable amount of damping to vary the rate of opening of device 100 under electronic control of the controller. Further, the controller is capable of controlling whether the active damper implements position stops and/or changing the angle at which position stops are implemented.

In one or more embodiments, the damping may be controlled, e.g., electronically controlled, based upon the position of device 100, the orientation of device 100, and the size of the angle formed by portion 102 and portion 104. In particular embodiments, position stops may be selectively implemented by the active damper under control of the controller based upon position of device 100, the orientation of device 100, and/or the size of the angle formed by portion 102 and 104. It should be appreciated that a controller can coupled to one or more sensors within device 100 such as accelerometers, gyroscopes, and other suitable motion sensors in order to detect position, orientation, and angle as described herein.

In one or more embodiments, position stops may be incorporated into the hinge mechanisms. In particular embodiments, the position stop mechanisms are passive. Examples of passive position stop mechanisms include cam/rockers, mechanical brakes, patterned magnetic brakes, and flat surfaces on rounded ends (e.g., ends 304 and 306) of each of portions 102 and 104. The passive position stop mechanisms can be incorporated to provide one or more position stops in the rotational movement of the hinge mechanisms so that device 100 has resistance and stops the automatic rotation (or opening) at particular angles of rotation. In the case of the flat surfaces, the flat surface(s) can be located on the rounded ends 304 and 306 of portions 102 and 104 so that the flat surface of portion 102 contacts the flat surface of portion 104 through synchronized movement in example embodiments as described in connection with FIGS. 7, 8, 9, 10, 11, and 12.

In one or more embodiments, elements such as cam/rockers and motors and/or generators may be used to provide position stops. The cam/rockers and motors and/or generators are examples of active position stop mechanisms.

As noted, active dampers can be electronically controlled to provide a variable amount of damping under control of a controller.

Figure 24:
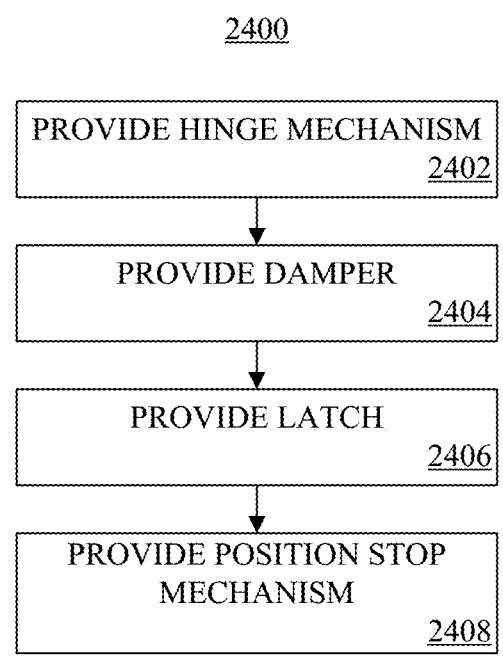
FIG. 24 illustrates a method of manufacturing a device having a powered hinge mechanism.

FIG. 24 illustrates a method 2400 of manufacturing a device having a powered hinge mechanism. Method 2400 can be performed to implement a device having a powered hinge mechanism as described herein.

In block 2402, a hinge mechanism is provided. The hinge mechanism is capable of rotatably coupling a first portion of the device to a second portion of the device. The hinge mechanism is further capable of automatically opening the device. The hinge mechanism can include a spine hinge, a rolling contact hinge, a film hinge, or a geared link hinge. The hinge mechanism, whether implemented as a spine hinge, a rolling contact hinge, a film hinge, or a geared link hinge, may be implemented as an active open hinge.

As an illustrative and non-limiting example, in the case of the spine hinge, a first retractable spine is provided. A second retractable spine is also provided that opposes the first retractable spine.

As another illustrative and non-limiting example, in the case of the rolling contact hinge, a first strap is provided. The first strap is coupled to a top surface of the first portion and a bottom surface of the second portion. A second strap is provided. The second strap is coupled to a bottom surface of the first portion and a top surface of the second portion. The first strap and the second strap facilitate rolling contact between a rounded end of the first portion and a rounded end of the second portion.

As another illustrative and non-limiting example, the rolling contact hinge can be a magnetic rolling contact hinge. In the case of a magnetic rolling contact hinge, a first array of magnets is provided. The first array of magnets is arranged in a first formation within a rounded end of the first portion. A second array of magnets is provided. The second array of magnets is arranged in a second formation within a rounded end of the second portion. The second formation is capable of opposing the first formation. Further, corresponding points along the first array of magnets and the second array of magnets are capable of attracting to facilitate rolling contact between the rounded end of the first portion and the rounded end of the second portion. In particular embodiments, the first formation is at least a partial helix having a first handedness and the second formation is at least a partial helix having an opposing handedness.

In another example, in the case of the magnetic rolling contact hinge, a first polymagnet is provided. The first polymagnet is implemented in a first formation within a rounded end of the first portion. A second polymagnet is provided. The second polymagnet is implemented in a second formation within a rounded end of the second portion. The second formation is capable of opposing the first formation. Further, corresponding points along the first polymagnet and the second polymagnet are capable of attracting to facilitate rolling contact between the rounded end of the first portion and the rounded end of the second portion. In particular embodiments, the first formation is at least a partial helix having a first handedness and the second formation is at least a partial helix having an opposing handedness.

As another illustrative and non-limiting example, in the case of the film hinge, a film is provided. The film hinge is capable of joining the first portion with the second portion. The film has a plurality of folds parallel to an axis of rotation of the hinge mechanism.

As another illustrative and non-limiting example, in the case of the geared link hinge, the geared link hinge is capable of coupling the first portion and the second portion. A damper can be provided that is integrated within the geared link hinge. In particular embodiments, a first gear is provided that is integrated into the first portion. A second gear is provided that is integrated into the second portion. The first gear engages with the second gear.

In block 2404, a damper is provided. The damper is capable of controlling a rate at which the hinge mechanism automatically opens the device. In one aspect, the damper is passive. In another aspect, the damper is active. As an illustrative and non-limiting example, when the damper is implemented as an active damper, the damper may be electronically controlled using a controller. As such, the damper is capable of providing a variable amount of damping to vary the rate at which the hinge mechanism opens the device.

In one or more embodiments, the hinge mechanism is capable of providing an angle of rotation of approximately 180 degrees formed of the first portion and the second portion. In one or more embodiments, the hinge mechanism is capable of providing an angle of rotation of approximately 360 degrees formed of the first portion and the second portion.

In block 2406, a latch is provided. The latch is capable of securing the first portion and the second portion in a closed position.

In an aspect, the latch is a magnetic latch. For example, a first set of magnetic poles can be provided on the first portion of the device. A second set of magnetic poles can be provided on the second portion of the device. The magnetic latch can be implemented or configured so that the first set of magnetic poles and the second set of magnetic poles are in a first alignment to attract when the magnetic latch is closed and in a second alignment to repel when the magnetic latch is opened.

In block 2408, a position stop mechanism optionally can be provided. The hinge mechanism is capable of providing a particular angle of rotation. The position stop mechanism is capable of providing a position stop at an angle that is less than the angle of rotation. In one aspect, the position stop mechanism is active. In one or more embodiments, the damper is capable of also implementing the position stop mechanism. For example, an active damper that can be electronically controlled can be controlled to provide a position stop and behave as a position stop mechanism under control of a controller. In another aspect, the position stop mechanism is passive.

Figures 1, 25:
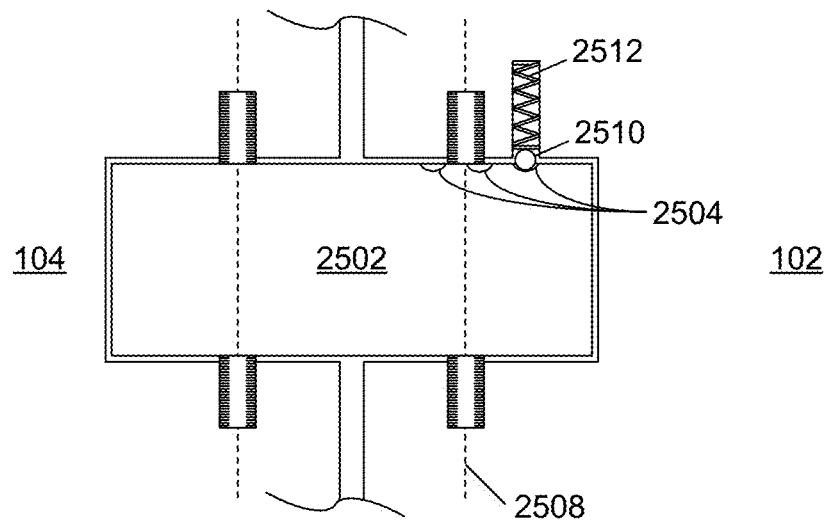
Figures 2, 25:
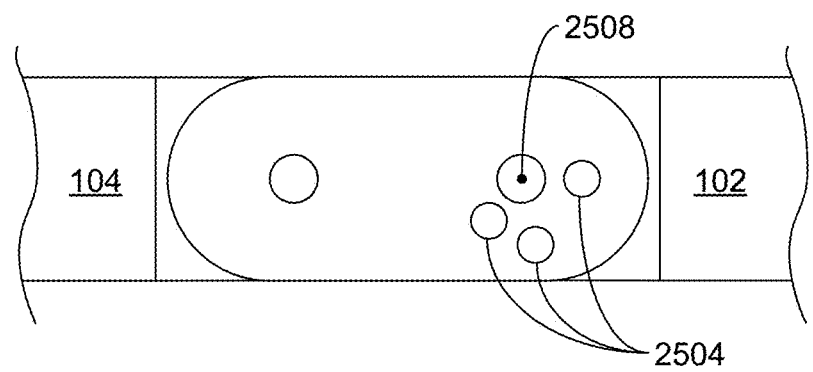

FIGS. 25-1 and 25-2 illustrate an example of a cam/rocker position stop mechanism. In the example of FIG. 25, a linkage 2502 is illustrated. In one or more embodiments, linkage 2502 may be used as the linkage in any of the examples described in connection with FIGS. 15-22 to provide position stops for device 100.

FIG. 25-1 is an overhead cutaway view of linkage 2502. In the example of FIG. 25-1, a plurality of rockers (e.g., indentations) 2504 are built into an outer surface of linkage 2502. Rockers 2504 serve as position stops for device 100. A spring 2512 and a cam 2510 are also built into linkage 2502. Spring 2512 and cam 2510, for example, may be included in a channel or slot of portion 102 so that cam 2510 is in contact with linkage 2502 by virtue of force exerted by spring 2512. Spring 2512 is capable of providing downward force (in reference to the position of linkage 2502 illustrated in FIG. 25-1) so that cam 2510 contacts linkage 2502 and is capable of settling into one of rockers 2504. As portion 102 rotates about axis of rotation 2508, cam 2510 is capable of settling into one or more of rockers 2504 in consequence of the force exerted by spring 2512.

In one or more embodiments, the cam rocker mechanism described in FIG. 25 is capable of stopping the automatic opening of device 100 as cam 2510 engages the first of rockers 2504. As device 100 is manually opened beyond the first cam, device 100 can continue to automatically open until a further rocker 2504 is encountered. Device 100 can be further manually opened beyond the second cam to continue automatically opening until a further cam is encountered.

FIG. 25-2 illustrates a side view of linkage 2502 showing the position of rockers 2504 in relation to axis of rotation 2508. Axis of rotation 2508 is going into the page in FIG. 25-2. While three cams (e.g., position stops) are illustrated in FIG. 25, the embodiments described herein are not intended to be limited by the number of position stops provided. Fewer position stops or more position stops may be provided.

FIGS. 26-1 through 26-4 illustrate an example of a magnetic brake 2600. Magnetic brake 2600 can be incorporated into linkage 2502. In one or more embodiments, position stops are provided by the magnetic patterns created in the magnets included in magnetic brake 2600.

FIG. 26-1 is an overhead cutaway view of linkage 2502 and magnetic brake 2600. As pictured, magnetic brake 2600 includes magnets 2602 and 2604. In one or more embodiments, magnet 2602 is implemented as a south (north) magnet having one or more north (south) regions implemented therein. Magnet 2606 is implemented as a north (south) magnet having one or more south (north) regions implemented therein.

Magnet 2602 is fixedly attached to linkage 2502. Brake pad 2606 is fixedly attached to magnet 2602. Magnet 2604 is keyed to device 100 and, more particularly, to portion 102 via key 2610. Magnet 2604, for example, rotates in synchrony with portion 102 about axis of rotation 2508. Brake pad 2608 is fixedly attached to magnet 2604.

FIG. 26-2 illustrates a cross-sectional view of magnets 2602 and 2604 and of brake pads 2606 and 2608. In the example shown, magnet 2602 is a south magnet having a north region 2612 included therein. Magnet 2605 is north magnet having a plurality of south regions 2614, 2616, and 2618 implemented therein. As portion 102 of device 100 rotates about axis 2508, position stops occur, e.g., resistive force opposing the automatic opening of device 100, when north region 2612 of magnet 2602 aligns with one of south regions 2614, 2616, or 2618 of magnet 2604.

FIG. 26-3 illustrates a side view of magnet 2602 showing north region 2612. FIG. 26-4 illustrates a side view of magnet 2604 showing south regions 2614, 2616, and 2618.

The particular number of regions (e.g., regions 2612, 2614, 2616, and 2618) shown, the size of such regions, and the positioning of such regions can be varied to create any of a variety of different force profiles. The force profile determines the location of position stops and how strong the position stop is to counteract the automatic opening of device 100.

Figures 1, 27:
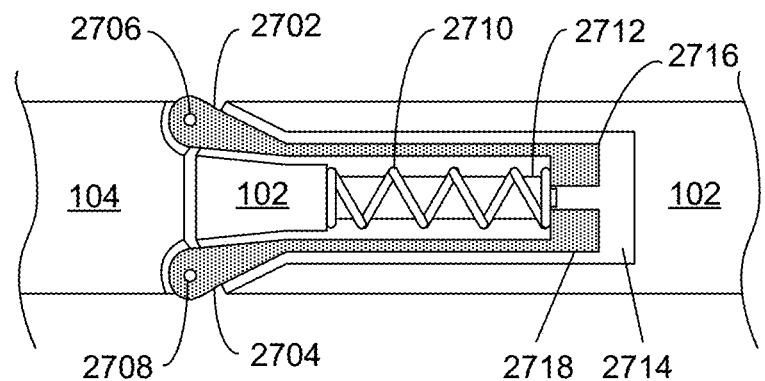
Figures 2, 27:
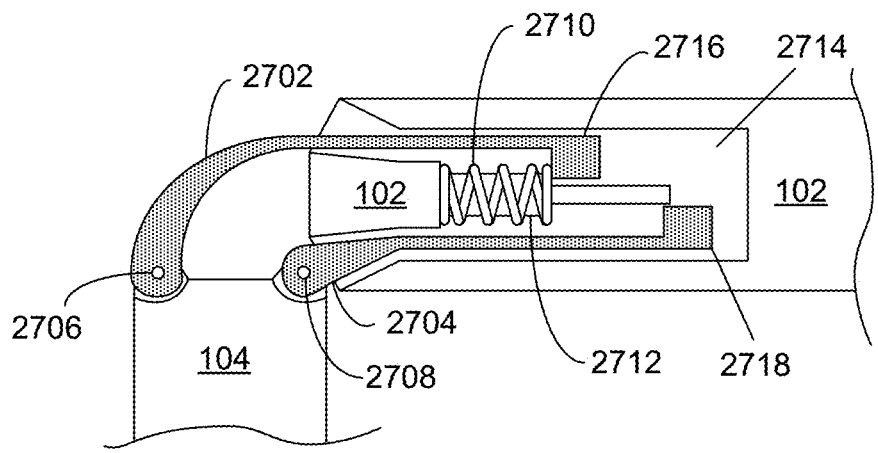

FIGS. 27-1 and 27-2 are side cutaway views illustrating another example of a spine hinge for device 100. The spine hinge of FIG. 27 includes spines 2702 and 2704. Spines 2702 and 2704 may be implemented using any of the materials described herein for spines as previously described in connection with FIGS. 1-6. Referring to FIG. 27-1, the spine hinge is shown in an open position with portion 102 and 104 forming an angle of 180 degrees or approximately 180 degrees. Spine 2702 is coupled to portion 104 using a pin 2706 or other suitable fastener. Spine 2704 is coupled to portion 104 using a pin 2708 or other suitable fastener. In one or more embodiments, spines 2702 and 2704 are rotatably coupled to portion 104.

Portion 102 includes a spring 2710 and a linear damper 2712. Spring 2710 and linear damper 2712 are within a channel 2714 or cavity of portion 102. Channel 2714 can include two slits, where spine 2702 exits channel 2714 through one slit while spine 2704 exits channel 2714 through another slit. Spring 2710 is capable of providing the force for automatically opening the spine hinge and device 100. Linear damper 2712 is capable of providing a dampening force that opposes the force exerted by spring 2710.

Referring to FIG. 27-2, device 100 is opened at an angle of approximately 90 degrees (as measured moving clockwise from portion 102 portion 104). As pictured, spine 2702 is extracted, at least partially, from channel 2714 thereby compressing spring 2710. Were device 100 rotated in the opposite direction to open at an angle of approximately 90 degrees (as measured moving counter-clockwise from portion 102 to 104), then spine 2704 is extracted from channel 2714 thereby compressing spring 2710.

As illustrated, spine 2702 includes a head portion 2716 and spine 2704 includes a head portion 2718. Each of head portions 2716 and 2718 is capable of engaging spring 2710 and linear damper 2710 to exert compressive force when device 100 is moved from the position illustrated in FIG. 27-1. In the example of FIG. 27-2 head portion 2716 is capable of grasping or catching spring 2710 and linear damper 2712 while device 100 is rotated from the position illustrated in FIG. 27-1 and compressing both. Were device 100 rotated in the opposite direction to open at an angle of approximately 90 degrees (as measured moving counter-clockwise from portion 102 to 104), then head portion 2718 of spine 2704 is capable of grasping or catching spring 2710 and linear damper 2712 and compressing both.

The spine hinge mechanism illustrated in FIG. 27 is capable of providing 360 degrees or approximately 360 degrees of rotation. A suitable latch as described herein can be provided to maintain device in a closed position or in an open position, e.g., when opened 365 degrees from the closed position. In one or more embodiments, the spine hinge mechanism illustrated in FIG. 27 can include more than one spring 2710 and linear damper 2712 within channel 2714.

The terminology used herein is for the purpose of describing particular embodiments only and is not intended to be limiting. Notwithstanding, several definitions that apply throughout this document now will be presented.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

By the term "approximately" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

As defined herein, the terms "one embodiment," "an embodiment," "one or more embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), and a controller.

The terms first, second, etc. may be used herein to describe various elements. These elements should not be limited by these terms, as these terms are only used to distinguish one element from another unless stated otherwise or the context clearly indicates otherwise.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order.

The corresponding structures, materials, acts, and equivalents of all means or step plus function elements that may be found in the claims below are intended to include any structure, material, or act for performing the function in combination with other claimed elements as specifically claimed.

The description of the embodiments provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the embodiments disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A device, comprising:
   a first portion;
   a second portion having a channel;
   a hinge mechanism having a hinge and a spine, wherein the hinge is coupled to the first portion and the second portion and rotatably couples the first portion to the second portion, wherein a first surface of the first portion contacts a first surface of the second portion when the device is in a closed position, wherein the hinge provides an angle of rotation of approximately 180 degrees formed of the first portion and the second portion, and wherein the hinge defines the angle of rotation;

wherein a first edge of the spine is fixedly attached to the first portion;

a damper within the channel of the second portion, wherein a second edge of the spine that is distal to the first edge is attached to the damper;

a spring mounted to the damper in the channel, wherein the spring retracts to automatically open the hinge mechanism and draw the spine into the second portion while opening, wherein the second edge of the spine retracts into the second portion when the device transitions between the closed position and an open position;

wherein the damper controls a rate at which the spring automatically opens the hinge mechanism; and side coverings closing off a region between the spine and the hinge and having an orientation perpendicular to an axis of rotation of the hinge, wherein each side covering expands when the device is in the closed position and maintains the spine at a desired curvature, and wherein each side covering collapses between respective ends of the first portion and the second portion when the device is in the open position.

2. The device of claim 1, wherein the region is water tight.

3. The device of claim 1, further comprising:
a latch maintaining the device in the closed position.

4. The device of claim 1, wherein the damper is pneumatic or hydraulic.

5. The device of claim 3, wherein, in response to release of the latch, the hinge mechanism automatically opens.

6. The device of claim 5, wherein the latch releases in response to a successful electronic authentication of a user of the device.

7. The device of claim 5, wherein the latch is a magnetic latch.

8. A method, comprising:
providing a hinge mechanism having a hinge and a spine, wherein the hinge is coupled to a first portion of a device and a second portion of the device, wherein the hinge rotatably couples the first portion to the second portion, wherein a first surface of the first portion contacts a first surface of the second portion when the device is in a closed position, wherein the hinge provides an angle of rotation of approximately 180 degrees formed of the first portion and the second portion, and wherein the hinge defines the angle of rotation;

wherein a first edge of the spine is fixedly attached to the first portion;

providing a damper within a channel of the second portion, wherein a second edge of the spine that is distal to the first edge is attached to the damper;

providing a spring mounted to the damper in the channel, wherein the spring retracts to automatically open the hinge mechanism and draw the spine into the second portion while opening, wherein the second edge of the spine retracts into the second portion when the device transitions between the closed position and an open position;

wherein the damper controls a rate at which the spring automatically opens the hinge mechanism; and providing side coverings closing off a region between the spine and the hinge and having an orientation perpendicular to an axis of rotation of the hinge, wherein each side covering expands when the device is in the closed position and maintains the spine at a desired curvature, and wherein each side covering collapses between respective ends of the first portion and the second portion when the device is in the open position.

9. The method of claim 8, further comprising:
providing a latch configured to secure the first portion and the second portion in the closed position.

10. The method of claim 9, wherein the latch is a magnetic latch.

11. The method of claim 9, wherein, in response to release of the latch, the hinge mechanism automatically opens.

12. The method of claim 11, wherein the latch releases in response to a successful electronic authentication of a user of the device.

13. The method of claim 8, wherein the region is water tight.

14. The method of claim 8, wherein the damper is pneumatic or hydraulic.

* * * * *